(12) United States Patent
Shimomaki et al.

(10) Patent No.: US 6,653,216 B1
(45) Date of Patent: Nov. 25, 2003

(54) TRANSPARENT ELECTRODE FORMING APPARATUS AND METHOD OF FABRICATING ACTIVE MATRIX SUBSTRATE

(75) Inventors: Shinichi Shimomaki, Akishima (JP); Makoto Miyagawa, Fussa (JP); Hiromitsu Ishii, Hamura (JP); Yayoi Nakamura, Hino (JP); Toshiaki Higashi, Yokohama (JP)

(73) Assignee: Casio Computer Co., Ltd., Tokyo (JP)

( * ) Notice: Subject to any disclaimer, the term of this patent is extended or adjusted under 35 U.S.C. 154(b) by 97 days.

(21) Appl. No.: 09/840,220

(22) Filed: Apr. 23, 2001

Related U.S. Application Data

(63) Continuation-in-part of application No. 09/325,832, filed on Jun. 4, 1999.

(30) Foreign Application Priority Data

| Jun. 8, 1998 | (JP) | ............................................ 10-173836 |
| Jul. 31, 1998 | (JP) | ............................................ 10-229457 |
| Dec. 1, 1998 | (JP) | ............................................ 10-355443 |
| Apr. 28, 2000 | (JP) | ........................................ 2000-129661 |

(51) Int. Cl.[7] ......................... H01L 21/44; H01L 21/00; H01L 21/302
(52) U.S. Cl. ....................... 438/608; 438/151; 438/155; 438/711; 438/715; 438/720; 438/742
(58) Field of Search ................................. 438/151, 155, 438/161, 164, 608, 711, 715, 720, 742, 735, 737

(56) References Cited

U.S. PATENT DOCUMENTS

| 3,879,446 | A | * | 4/1975 | Blood et al. ................. 560/214 |
| 5,032,883 | A | | 7/1991 | Wakai et al. |
| 5,162,933 | A | * | 11/1992 | Kakuda et al. ................ 349/46 |
| 5,283,566 | A | | 2/1994 | Mimura et al. |
| 5,296,096 | A | * | 3/1994 | Enomoto et al. .............. 216/23 |
| 5,334,859 | A | | 8/1994 | Matsuda |
| 5,643,817 | A | | 7/1997 | Kim et al. |
| 5,667,631 | A | * | 9/1997 | Holland et al. ................ 216/13 |
| 5,723,366 | A | * | 3/1998 | Suzuki et al. ................ 438/712 |
| 5,784,133 | A | | 7/1998 | Kim et al. |
| 5,817,156 | A | * | 10/1998 | Tateyama et al. ........... 29/25.01 |
| 5,817,178 | A | * | 10/1998 | Mita et al. ................... 118/666 |
| 5,843,277 | A | * | 12/1998 | Goto et al. .................... 216/23 |
| 5,930,607 | A | | 7/1999 | Satou |
| 6,036,876 | A | * | 3/2000 | Chen et al. .................... 216/67 |
| 6,037,712 | A | * | 3/2000 | Codama et al. ............. 313/498 |
| 6,078,365 | A | * | 6/2000 | Ueda et al. .................... 349/43 |
| 6,157,066 | A | | 12/2000 | Kobayashi |
| 6,172,733 | B1 | * | 1/2001 | Hong et al. ................. 349/152 |

FOREIGN PATENT DOCUMENTS

JP 60-42868 3/1985

* cited by examiner

Primary Examiner—Matthew Smith
Assistant Examiner—Lex H. Malsawma
(74) Attorney, Agent, or Firm—Frishauf, Holtz, Goodman & Chick, P.C.

(57) ABSTRACT

An active matrix substrate includes a line layer formed of an Al-based metal layer and a part of which is exposed through a contact hole formed in an insulating film. In the active matrix substrate, pixel electrodes are formed of an ITO film on the insulating film, and a jumper line for connecting a disconnected portion of a protect ring, a surface layer of a data line connecting pad, and a line protecting film are formed at the same time as the pixel electrodes are formed. This reduces the number of fabrication steps. The ITO film is patterned by dry etching due to reactive ion etching using a mixed gas of a hydrogen halide gas and an inert gas, with the temperatures of the center portion and peripheral portion of the substrate substantially equalized to each other.

9 Claims, 20 Drawing Sheets

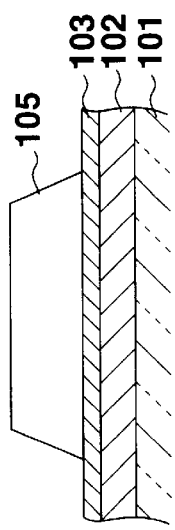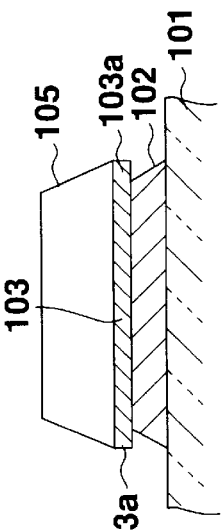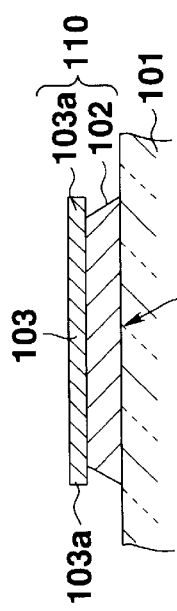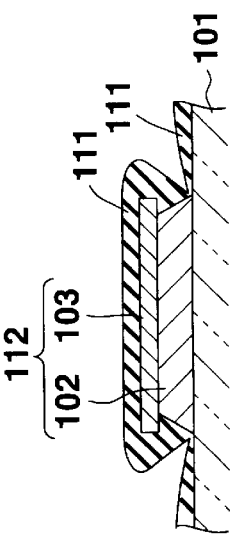
FIG.17A  FIG.17B  FIG.17C  FIG.17D
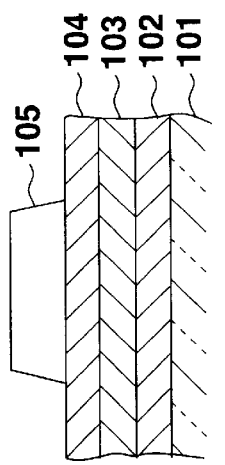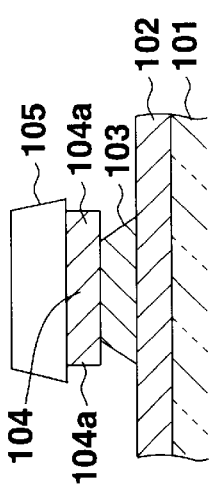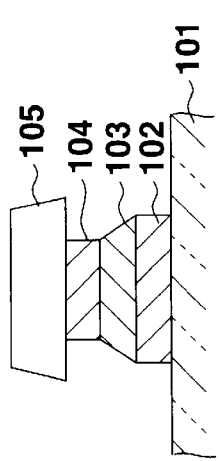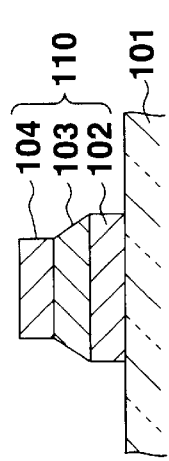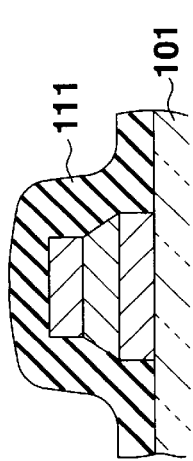
FIG.16A  FIG.16B  FIG.16C  FIG.16D  FIG.16E

TRANSPARENT ELECTRODE FORMING APPARATUS AND METHOD OF FABRICATING ACTIVE MATRIX SUBSTRATE

CROSS-REFERENCE TO RELATED APPLICATIONS

This is a Continuation-in-Part application of U.S. patent application Ser. No. 09/325,832, filed Jun. 4, 1999, the entire contents of which are incorporated herein by reference.

This application is based upon and claims the benefit of priority from the prior Japanese Patent Applications No. 10-173836, filed Jun. 8, 1998; No. 10-229457, filed Jul. 31, 1998; No. 10-355443, filed Dec. 1, 1998, and No. 2000-129661, filed Apr. 28, 2000, the entire contents of all of which are incorporated herein by reference.

BACKGROUND OF THE INVENTION

The present invention relates to a method of fabricating an active matrix substrate in a display panel or the like, and an apparatus for forming a transparent electrode in the matrix substrate.

Active matrix substrates using thin film transistors are often used as active matrix substrates for use in conventional liquid crystal display panels or the like. Such active matrix substrates are usually fabricated by forming a plurality of active matrix constructions on a transparent plate having a size corresponding to a plurality of display panels and separating the plate into individual active matrix substrates, by cutting. FIGS. 18 and 19 show examples of equivalent circuit plan views of one display panel when such display panels are formed on a glass plate having a size corresponding to a plurality of display panels.

This active matrix substrate includes a glass plate 1 having a size corresponding to a plurality of display panels. The surface of this glass plate 1 has a display region 5 for displaying an image and a non-display region 6 which is formed outside the display region 5 and does not display images. After the active matrix constructions are formed, the glass plate 1 is cut along cut lines 2 to separate the display panel units. That is, the region inside the cut lines 2 is a panel formation region 3, and the region outside this panel formation region 3 is a surplus region 4. Lattice-like short lines 15 are formed on this surplus region 4. In the display region 5, a plurality of pixel electrodes 7 and a plurality of thin film transistors 8 connected with these pixel electrodes 7 are formed in a matrix manner. A plurality of scan lines 9 supply a scan signal to gates G of the thin film transistors 8. A plurality of data lines 10 formed on the glass substrate supply a display signal to drain electrodes D of the thin film transistors 8. This display region 5 also includes a plurality of auxiliary capacitor lines 11 for forming auxiliary capacitors Cs between these auxiliary capacitor lines 11 and the pixel electrodes 7, and a protect ring 12 formed around the pixel electrodes 7. In the construction shown in FIG. 18, the right end portion of each auxiliary capacitor line 11 is connected to the short line 15 via a common line 24 and a connecting pad 25 formed outside the right edge of the protect ring 12. As shown in FIG. 19, each auxiliary capacitor line 11 is sometimes connected to the protect ring 12 and then connected to the short line 15 via the connecting pad 25. Outside the protect ring 12, a scan line protective element 13 is formed for each scan line 9, and a data line protective element 14 is formed for each data line 10. The scan line protective element 13 includes two thin film transistors 13a and 13b inserted between the protect ring 12 and the scan line 9. The data line protective element 14 includes two thin film transistors 14a and 14b inserted between the protect ring 12 and the data line 10. These protective elements 13 and 14 prevent insulation breakdown of the thin film transistor 8 caused by high-voltage static electricity generated during the fabrication process or prevent changes in the voltage-current characteristics.

The left end portion of each scan line 9 is connected to the short line 15 via a scan line connecting pad 17 formed in a scan line driving semiconductor chip mounting region 16 in the non-display region 6. The upper end portion of each data line 10 is connected to the short line 15 via a data line connecting pad 19 formed in a data line driving semiconductor chip mounting region 18 in the non-display region 6. Input connecting pads 20 formed in the semiconductor chip mounting region 16 and input connecting pads 21 formed in the semiconductor chip mounting region 18 are connected, via lines 23, to external connecting terminals 22 which are to be connected to an external control circuit and the like. These external connecting terminals 22 are further connected to the short line 15.

Both of a gate electrode G and a source electrode S of the thin film transistor 13a of the scan line protective element 13 including two thin film transistors are connected to the scan line 9. A drain electrode D of this thin film transistor 13a is connected to the protect ring 12. A gate electrode G and a source electrode S of the other thin film transistor 13b are connected together to the protect ring 12. A drain electrode D of this thin film transistor 13b is connected to the scan line 9. Both of a gate electrode G and a source electrode S of the thin film transistor 14a of the data line protective element 14 including two thin film transistors are connected to the protect ring 12. A drain electrode D of this thin film transistor 14a is connected to the data line 10. A gate electrode G and a source electrode S of the other thin film transistor 14b are connected together to the data line 10. A drain electrode D of this thin film transistor 14b is connected to the protect ring 12.

In the active matrix substrate with the above construction, the source and drain electrodes of the thin film transistors and the data lines are usually formed at the same time by using the same material. To reduce the contact resistance between the source electrode S of the thin film transistor and the pixel electrode 7 made of Indium-Tin-Oxide (ITO), the drain electrodes D and the source electrodes S of the thin film transistors and the data lines 10 are often formed by a metal film made of a metal, such as Cr (Chromium), Ti (Titanium), Ta (Tantalum), or Mo (Molybdenum), which has a higher oxidation-reduction potential than that of an Al (Aluminum) alloy (to be referred to as an Al-based metal hereinafter) and hence is more sparingly oxidizable than an Al-based metal. When any of such metals is used, the contact resistance between the source electrode S and the ITO pixel electrode 7 reduces. However, since these metals are high-resistance metals, the resistance of the data line 10 increases if the width of the data line 10 decreases, and this increases the wiring time constant. Accordingly, the width of the data line 10 cannot unlimitedly be decreased, so the opening ratio is difficult to increase. To prevent this, therefore, the source and drain electrodes of the thin film transistors and the data lines are formed by a two-layered structure including a Cr layer and an Al-based metal layer and connected to the ITO pixel electrodes 7 via this Cr layer. Consequently, the Cr layer reduces the contact resistance, and the Al-based metal layer reduces the data line resistance. A structure as shown in a sectional view of FIG. 20 is known as an active matrix substrate having this arrangement. This active matrix substrate is fabricated by forming steps as shown in FIG. 21. Note that the thin film transistors constructing the protective elements 13 and 14 are formed in substantially the same manner as the thin film transistors 8, so a detailed description thereof will be omitted.

First, in step P1 (metal film formation step) shown in FIG. 21, a film of Al (aluminum) or an Al-based metal is formed on the upper surface of a glass plate 1. In step P2 (first photoresist formation step) shown in FIG. 21, a first photoresist film is formed on the upper surface of this Al-based metal film. In step P3 (scan line and the like formation step) shown in FIG. 21, this first photoresist film is used as a mask to selectively etch the Al-based metal film, thereby forming, e.g., a gate electrode G for a thin film transistor 8, a scan line 9, a lower metal layer 17a for a connecting pad 17, an auxiliary capacitor line 11, upper and lower edges 12a for a protect ring 12, a line 23, and a lower metal layer 22a for an external connecting terminal 22.

In step P4 (three film formation step) shown in FIG. 21, a gate insulating film 31, an amorphous silicon semiconductor film 34, and a silicon nitride blocking layer formation film are successively formed. In step P5 (second photoresist formation step) shown in FIG. 21, a second photoresist film is formed. In step P6 (blocking layer formation step) shown in FIG. 21, this second photoresist film is used as a mask to selectively etch the blocking layer formation film, thereby forming a blocking layer 32 on the upper surface of the semiconductor layer 34 above the gate electrode G for a thin film transistor 8 and a blocking layer 33 on the upper surface of a semiconductor film 37 in a region where the scan line 9 and a data line 10 are expected to intersect. In step P7 ($n^+$-type silicon film formation step) shown in FIG. 21, an $n^+$-type silicon film is formed by a method such as plasma CVD.

In step P8 (third photoresist formation step) shown in FIG. 21, a third photoresist film is formed on this $n^+$-type silicon film. In step P9 (device area formation step) shown in FIG. 21, this third photoresist film is used as a mask to selectively etch the $n^+$-type silicon film and the semiconductor films 34 and 37, thereby forming a device area by leaving the semiconductor film 34 in the form of an island behind in a predetermined portion on the upper surface of the gate insulating film 31 in a thin film transistor 8 and the like region. At the same time, $n^+$-type silicon films 35 and 36 on the drain and source sides, respectively, of a thin film transistor are formed on the two sides of the upper surface of the blocking layer 32 and on the two sides of the upper surface of the semiconductor film 34. Also, the semiconductor film 37 is left behind in the form of an island below the blocking layer 33 in the region where the scan line 9 and a data line 10 are expected to intersect.

In step P10 (ITO film formation step) shown in FIG. 21, an ITO film for forming a pixel electrode is formed. In step P11 (fourth photoresist formation step) shown in FIG. 21, a fourth photoresist film is formed on the ITO film. In step P12 (pixel electrode formation step) shown in FIG. 21, this fourth photoresist film is used as a mask to selectively etch the ITO film, thereby forming a pixel electrode 7 connected to the $n^+$-type silicon film 36 of the thin film transistor in the thin film transistor 8 and the like region.

In step P13 (fifth photoresist formation step) shown in FIG. 21, a fifth photoresist film is formed. In step P14 (contact hole formation step) shown in FIG. 21, the fifth photoresist film is used as a mask to form contact holes in predetermined portions. That is, in a protect ring connecting region, a contact hole 38 is formed in that portion of the gate insulating film 31, which corresponds to the two end portions of the upper and lower edges 12a for a protect ring 12. In a scan line connecting pad 17 region, a contact hole 39 is formed in that portion of the gate insulating film 31, which corresponds to the connecting pad 17. In an external connecting terminal 22 region, a contact hole 40 is formed in that portion of the gate insulating film 31, that corresponds to the external connecting terminal 22.

In step P15 (three film formation step) shown in FIG. 21, a Cr film, Al-based metal film, and Cr film are successively formed. In step P16 (sixth photoresist formation step) shown in FIG. 21, a sixth photoresist film is formed. In step P17 (data line and the like formation step) shown in FIG. 21, this sixth photoresist film is used as a mask to sequentially selectively etch the three films described above. In step P18 (upper Cr film removal step) shown in FIG. 21, the upper Cr film is removed to form a data line 10 constructed of two layers, i.e., a Cr film 10a and an Al-based metal film 10b. In the thin film transistor 8 and the like region, a drain electrode D constructed of two layers, i.e., a Cr film and Al-based metal film, is formed on the upper surface of an $n^+$-type silicon film 35 on the drain side. Also, a source electrode S constructed of two layers, i.e., the Cr film and Al-based metal film, is formed on the upper surface of an $n^+$-type silicon film 36 on the source side. Furthermore, portions except for the upper and lower edges 12a for a protect ring 12, i.e., left and right edges 12b for a protect ring 12 are formed by two layers, i.e., a Cr film and Al-based metal film. In the protect ring 12 connecting region, the two end portions of the protect edges 12b are connected to the two end portions of the protect edges 12a via the contact hole 38. In the scan line connecting pad 17 region, a connecting pad 17b constructed of two layers, i.e., a Cr film and Al-based metal film, is connected to the connecting pad 17a via the contact hole 39 in a predetermined portion on the upper surface of the gate insulating film 31. In a data line connecting pad 19 region, a connecting pad 19 constructed of two layers, i.e., a Cr film and Al-based metal film, is formed in a predetermined portion on the upper surface of the gate insulating film 31.

In step P19 (overcoat film formation step) shown in FIG. 21, a silicon nitride overcoat film 41 is formed. In step P20 (seventh photoresist formation step) shown in FIG. 21, a seventh photoresist film is formed. In step P21 (opening formation step) shown in FIG. 21, this seventh photoresist film is used as a mask to form openings in predetermined portions of the overcoat film 41. That is, in the scan line connecting pad 17 region, an opening 42 is formed in a portion corresponding to the connecting pad 17b. In the data line connecting pad 19 region, an opening 43 is formed in a portion corresponding to the connecting pad 19. In the thin film transistor 8 and the like region, an opening 45 is formed in a portion corresponding to a predetermined portion of the pixel electrode 7. In the external connecting terminal 22 region, an opening 44 is formed in a portion corresponding to an external connecting terminal 22b. The display panel shown in FIG. 20 is formed through the above steps.

In the active matrix substrate formed by the above fabrication method, the data lines and the source and drain electrodes of the thin film transistors are formed by two layers, i.e., a Cr film and Al-based metal film. Consequently, it is possible to reduce the resistance and decrease the width of the data lines. However, the active matrix substrate fabrication process shown in FIG. 21 has many steps of forming a photoresist and performing pattern formation by using a photomask. That is, the fabrication process shown in FIG. 21 has seven such steps as follows:

(1) Formation of the scan lines and the like in steps P2 and P3.
(2) Formation of the blocking layer in steps P5 and P6.
(3) Formation of the device area by removing unnecessary portions of the semiconductor film and the like in steps P8 and P9.
(4) Formation of the pixel electrodes in steps P11 and P12.
(5) Formation of the contact holes in the gate insulating film in steps P13 and P14.
(6) Formation of the data lines and the like in steps P16, P17, and P18.
(7) Formation of the contact holes in the overcoat film in steps P20 and P21.

This indicates that seven photomasks are necessary, and these photomasks increase the fabrication cost. Additionally, this fabrication process having a large number of steps as described above lowers the throughput. Also, the fabrication cost is difficult to reduce because the number of factors which leads to a decline in the yield increases.

BRIEF SUMMARY OF THE INVENTION

It is an object of the present invention to reduce the number of fabrication steps by reducing the number of photoresist formation steps in the fabrication of an active matrix substrate in which pixel electrodes connected to switching elements are formed in a matrix manner.

It is another object of the present invention to provide a transparent electrode forming apparatus for satisfactorily forming a transparent electrode such as a pixel electrode in the above active matrix substrate.

It is a further object of the present invention to provide a method for manufacturing an active matrix substrate capable of reducing the contact resistance between a pixel electrode and a switching element, reducing the resistance of a data line, and improving the reliability of wiring formed by a multilayered film.

To achieve the above objects, an active matrix substrate according to the present invention is so fabricated that components of the active matrix substrate are covered with an overcoat film except for a pixel electrode, and include a connecting pad formed of Al-based metal and exposed through a contact hole formed in the overcoat film, a pixel electrode formed on the overcoat film, a jumper line for connecting a disconnected portion of a protect ring, an uppermost layer of a connecting pad connected to a data line, and a line passivation film formed on the overcoat film and corresponding to a line formed below the overcoat film, wherein at least one of the jumper line, the uppermost layer of the connecting pad, and the passivation film is made of the same ITO film as the pixel electrode.

To achieve the above objects, a method of fabricating an active matrix substrate according to the present invention comprises forming a scanning line, a gate electrode of Al-based metal, gate insulating film, semiconductor film, data line, source electrode, and drain electrode on a substrate, covering these components with an overcoat film, and forming a contact hole extending through the overcoat film and a contact hole extending through the overcoat film and the gate insulating film in predetermined portions by using one photoresist film, exposing a connecting pad connected to the scanning line and data line, forming a conductive layer of an ITO film on the overcoat film, forming a pixel electrode of an ITO film such that the pixel electrode is connected to the source electrode via the contact hole, forming a conductive film in the contact holes, and exposing the ITO film on the Al-based metal within the contact hole.

In this method, the jumper line, the uppermost layer of the connecting pad, and the line passivation film can be formed simultaneously with the pixel electrode of an ITO film. This can reduce the number of fabrication steps.

Furthermore, the transparent electrode forming apparatus according to the present invention performs reactive ion etching with a mixed gas of a hydrogen halide gas and an inert gas, and has a function of adjusting the temperatures of a peripheral portion and a center portion of the substrate. The apparatus patterns the ITO film on the substrate by performing dry etching due to the reactive ion etching, with the temperatures of the center and peripheral portions of the substrate substantially equalized to each other. Thereby, patterning of the ITO film can be uniformly performed in the substrate, with the Al-based metal exposed through the contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 16A to 16E are sectional views showing data line formation steps when a data line is formed by three metal layers;

FIGS. 17A to 17D are sectional views showing data line formation steps when a data line is formed by two layers;

DETAILED DESCRIPTION OF THE INVENTION

An active matrix substrate and a method of fabricating the same according to the present invention will be described in detail below on the basis of embodiments shown in the accompanying drawings.

Figure 1:
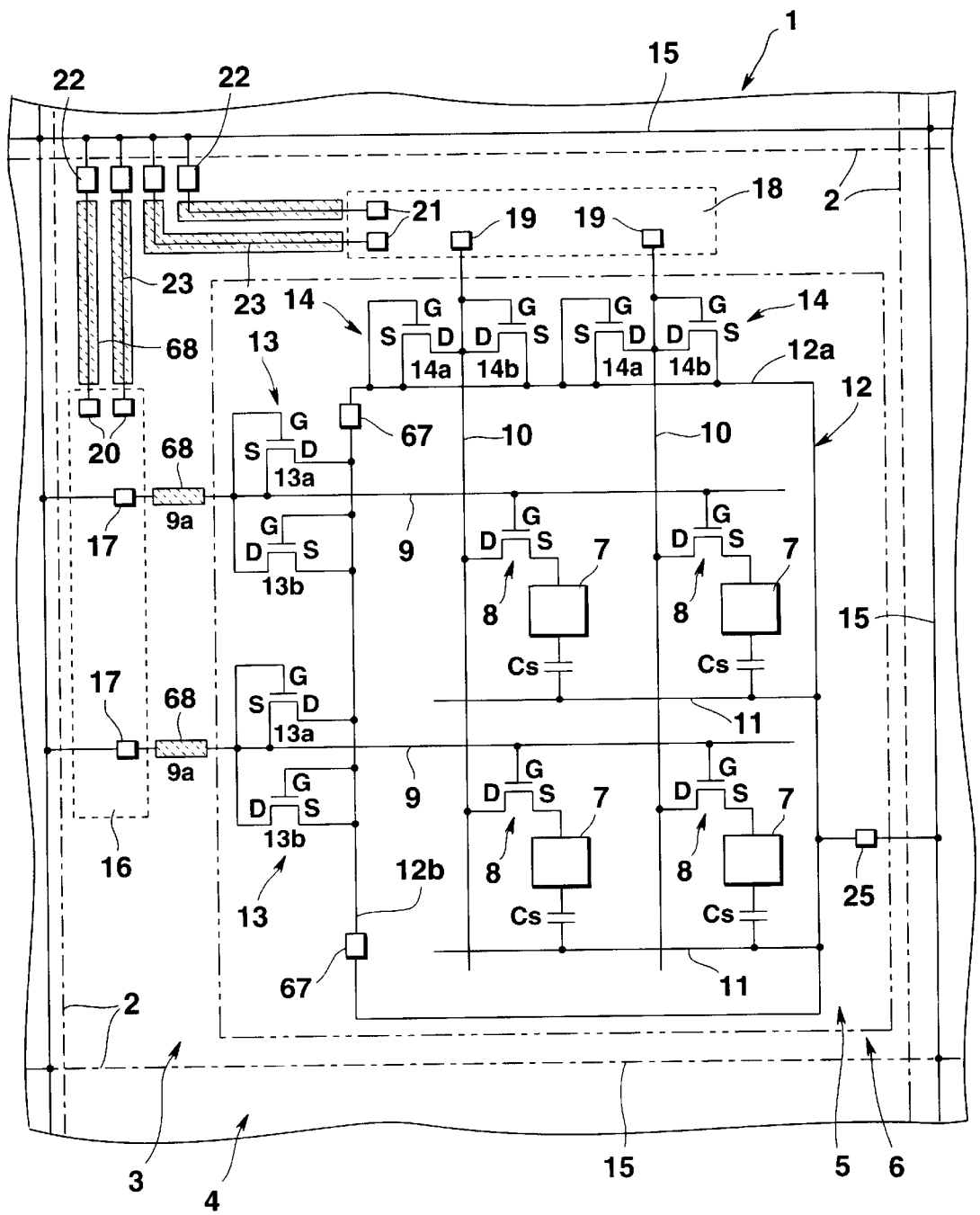
FIG. 1 is a circuit diagram showing an equivalent circuit plan view of an active matrix substrate according to the present invention formed on a transparent plate having a size corresponding to a plurality of such display panels.
Figure 19:
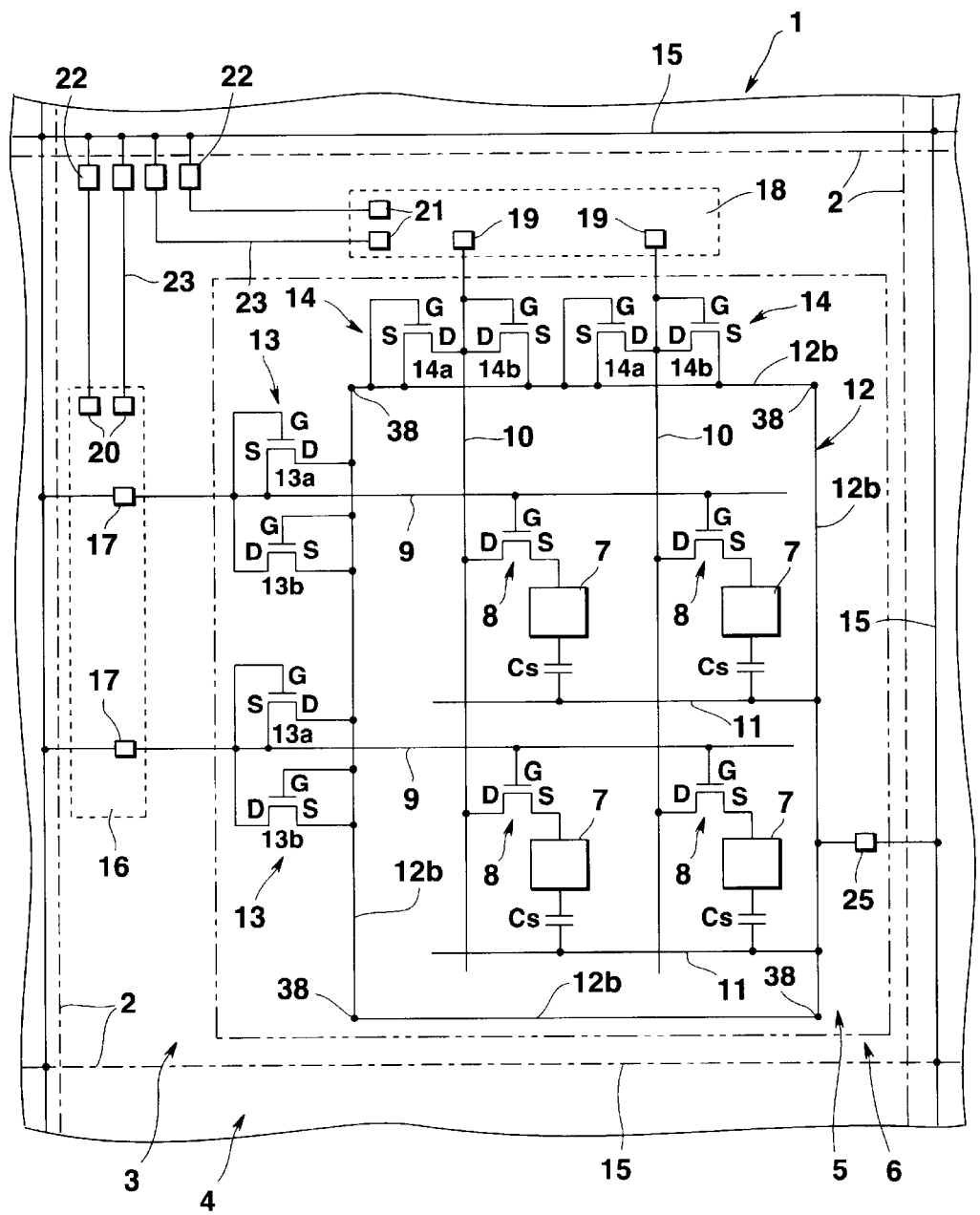
FIG. 19 is a circuit diagram showing an equivalent circuit plan view when another conventional active matrix substrate is formed on a substrate having a size corresponding to a plurality of such display panels.
Figure 20:
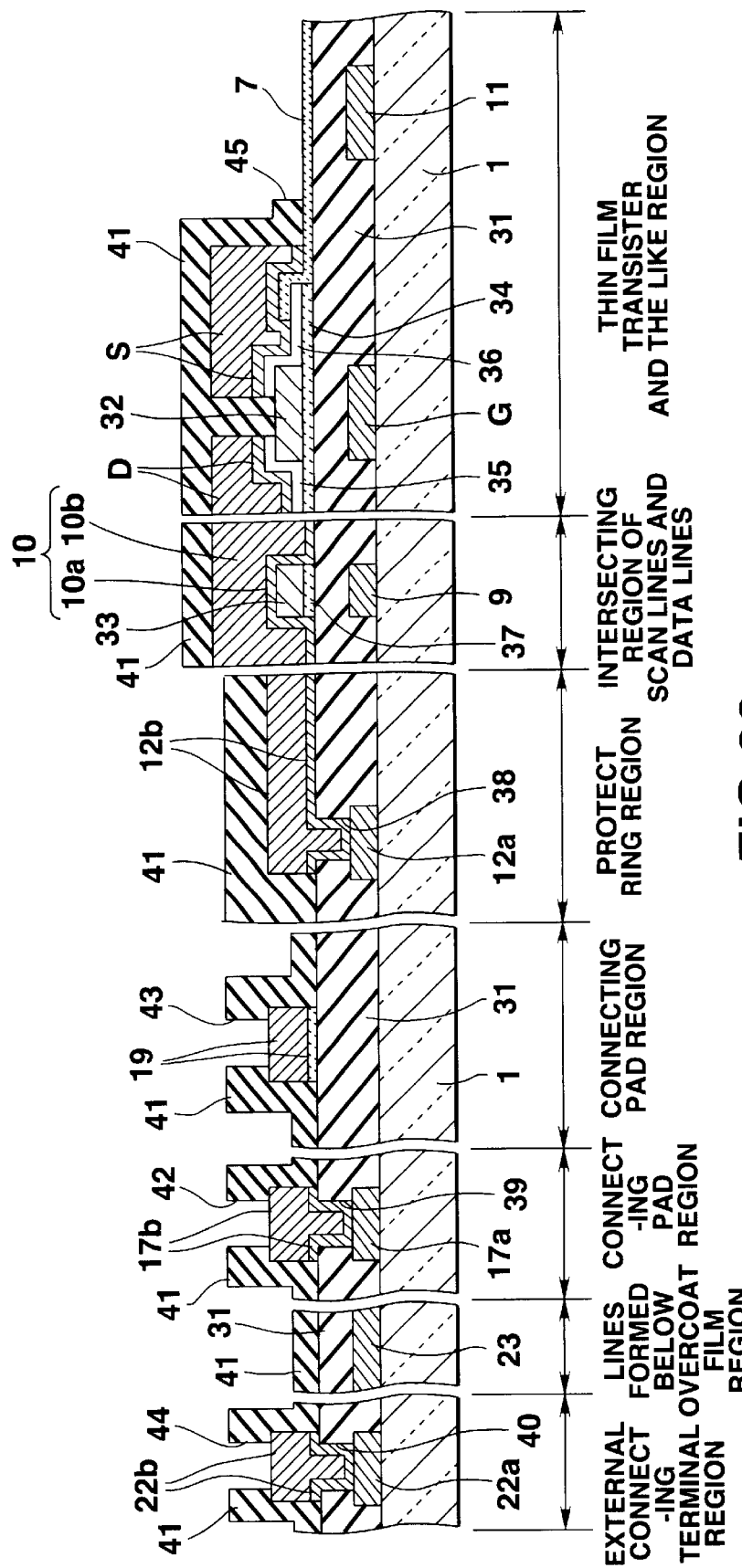
FIG. 20 is a sectional view of an active matrix display panel with a conventional structure.
Figure 21:
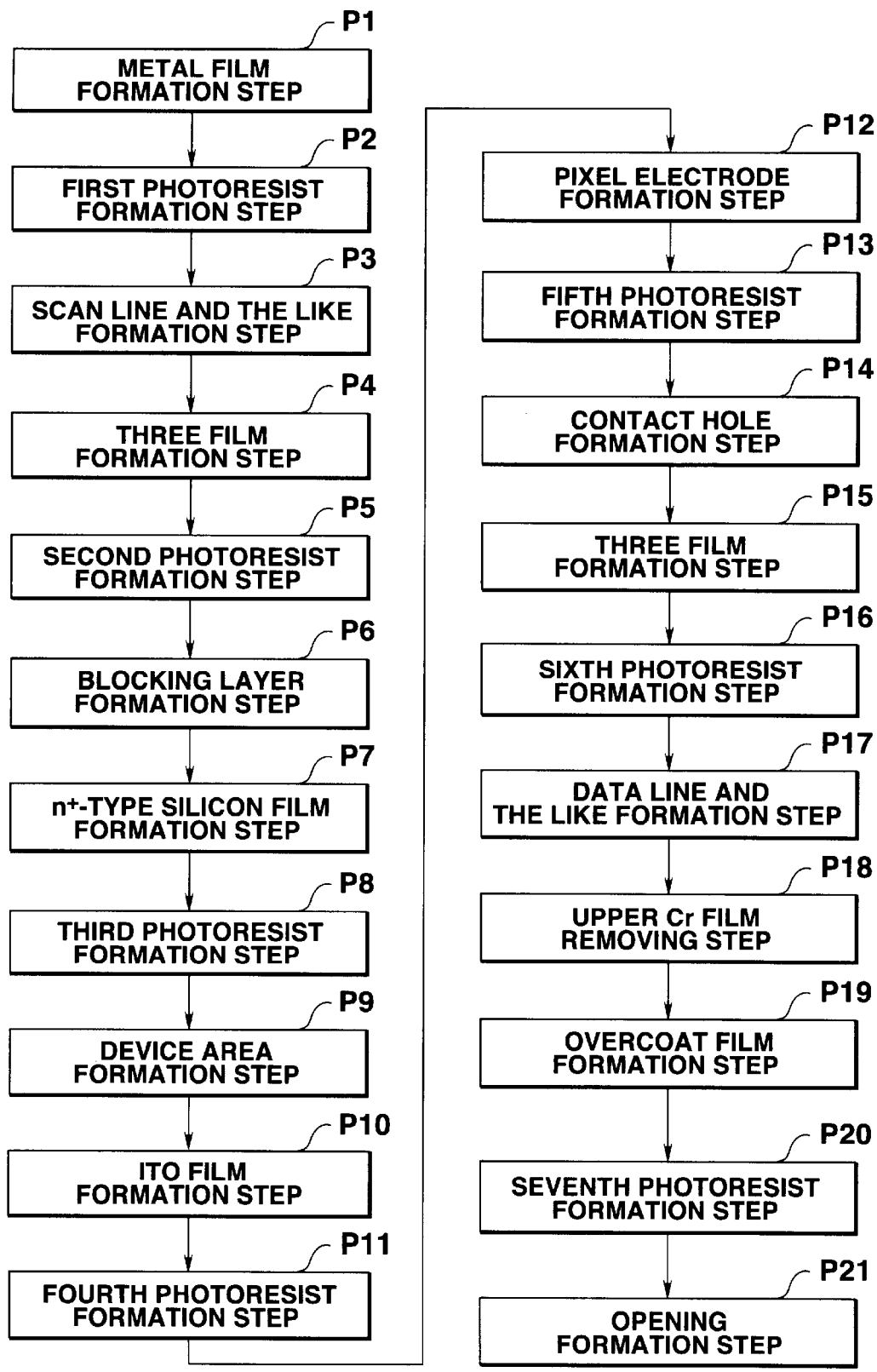
FIG. 21 is a flow chart showing the order of fabrication steps of fabricating the conventional active matrix panel shown in FIG. 20.

FIG. 1 shows an equivalent circuit plan view of one display panel when this active matrix substrate is formed on a glass plate having a size corresponding to a plurality of such display panels. This arrangement corresponds to the arrangement of the conventional active matrix substrate shown in FIG. 19, so the same reference numerals as in FIG. 19 denote the same parts in FIG. 1.

This active matrix substrate includes a glass plate 1 having a size corresponding to a plurality of display panels. The surface of the active matrix substrate has a display region 5 for displaying an image and a non-display region 6, such as a wiring region, which is formed outside the display region 5 and does not display images. The region surrounded by cut lines 2 for cutting the glass plate 1 into a plurality of glass substrate to separate display panel units after the active matrix substrates are formed is a panel formation region 3. The region outside this panel formation region 3 is a surplus region 4. In this surplus region 4, lattice-like short lines 15 are formed. In the display region 5, a plurality of pixel electrodes 7 and a plurality of thin film transistors 8 connected with the pixel electrodes 7 are formed in a matrix manner. A plurality of scan lines 9 are formed on the plate in the row direction and connected to gates G of the thin film transistors 8 in the row direction to supply a scan signal to the gates G of the thin film transistors 8 in the row direction. A plurality of data lines 10 are formed on the plate in the column direction and connected to drain electrodes D of the thin film transistors 8 in the column direction to supply a display signal to the drain electrodes D of the thin film transistors 8 in the column direction. Also, a plurality of auxiliary capacitor lines 11 for forming auxiliary capacitors Cs between these auxiliary capacitor lines 11 and the pixel electrodes 7 are connected to a right edge 12a of a protect ring 12 formed around the pixel electrodes 7. This protect ring 12 is connected to the short line 15 via a connecting pad 25.

The protect ring 12 is so formed as to surround the pixel electrodes 7 and has upper, lower, and right edges 12a formed simultaneously with the scan lines and a left edge 12b formed simultaneously with the data lines. The upper, lower and right edges 12a, and the left edge 12b are connected via jumper lines 67.

A scan line protective element 13 constructed of two thin film transistors 13a, 13b inserted between the protect ring 12 and the scan line 9 is formed for each scan line 9. A data line protective element 14 constructed of two thin film transistors 14a, 14b inserted between the protect ring 12 and the data line 10 is formed for each data line 10. Both of a gate electrode G and a source electrode S of the thin film transistor 13a of the scan line protective element 13 are connected to the scan line 9. A drain electrode D of the thin film transistor 13a is connected to the protective ring 12. A gate electrode G and a source electrode S of a thin film transistor 13b are connected together to the protect ring 12. A drain electrode D of the thin film transistor 13b is connected to the scan line 9. Both of a gate electrode G and a source electrode S of the thin film transistor 14a of the data line protective element 14 are connected to the protect ring 12. A drain electrode D of the thin film transistor 14a is connected to the data line 10. A gate electrode G and a source electrode S of the thin film transistor 14b are connected together to the data line 10. A drain electrode D of the thin film transistor 14b is connected to the protect ring 12.

The left end portion of each scan line 9 is connected to the short line 15 via a scan line connecting pad 17 formed in a scan line driving semiconductor chip mounting region 16 in the non-display region 6. The upper end portion of each data line 10 is connected to the short line 15 via a data line connecting pad 19 formed in a data line driving semiconductor chip mounting region 18 in the non-display region 6. Input connecting pads 20 formed in the semiconductor chip mounting region 16 and input connecting pads 21 formed in the semiconductor chip mounting region 18 are connected, via lines 23, to external connecting terminals 22 which are connected to an external control circuit (not shown)and the like. The external connecting terminals 22 are further connected to the short line 15. A line passivation film 68 for preventing breaking of lines is formed on an overcoat film 41 (FIG. 8) on the lines 23 and/or on an overcoat film 41 on scan line 9 formation regions 9a in the non-display region 6.

Figure 2:
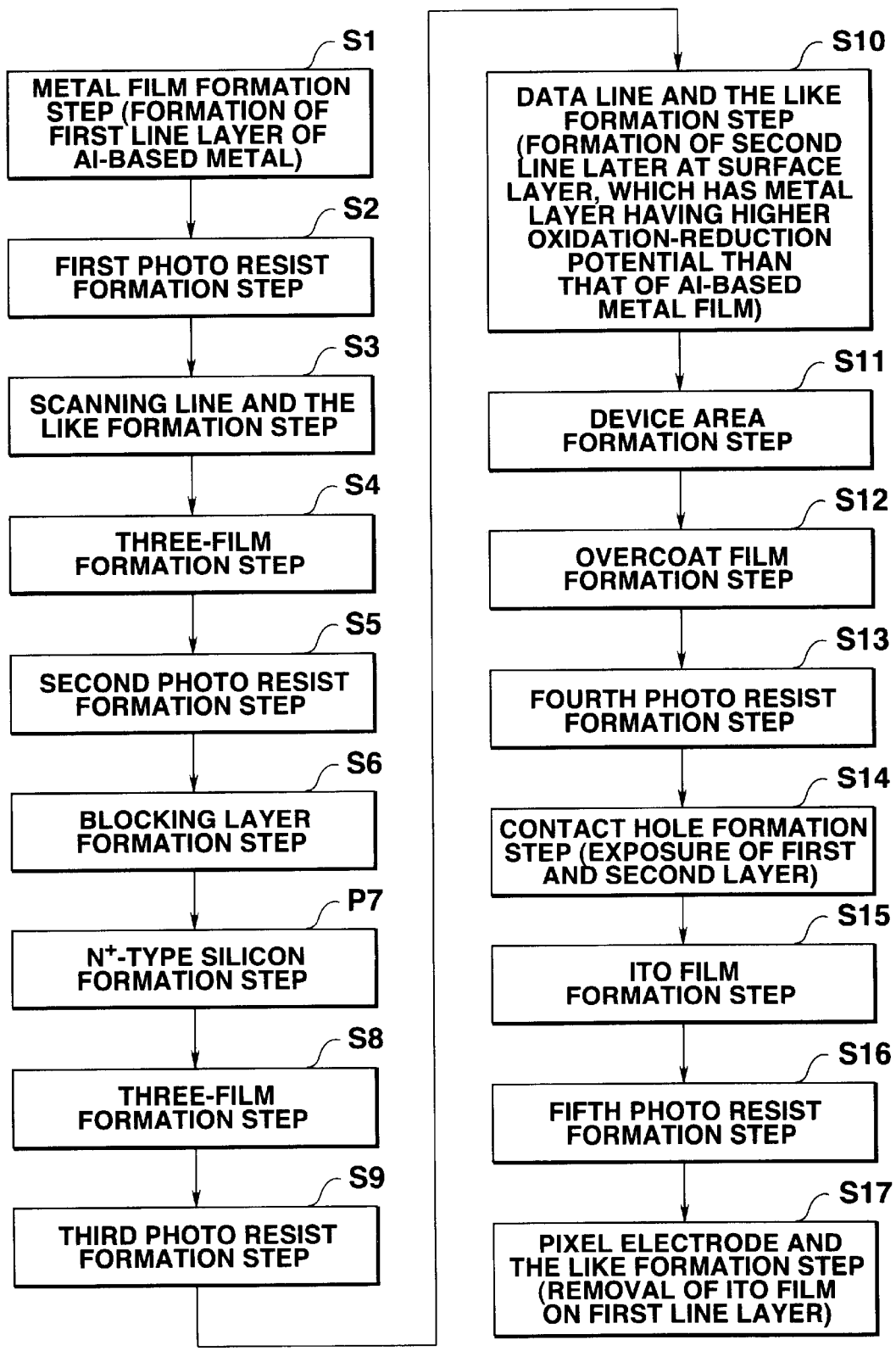
FIG. 2 is a flow chart showing the order of fabrication steps in the first embodiment of an active matrix substrate fabrication method according to the present invention.
Figure 3:
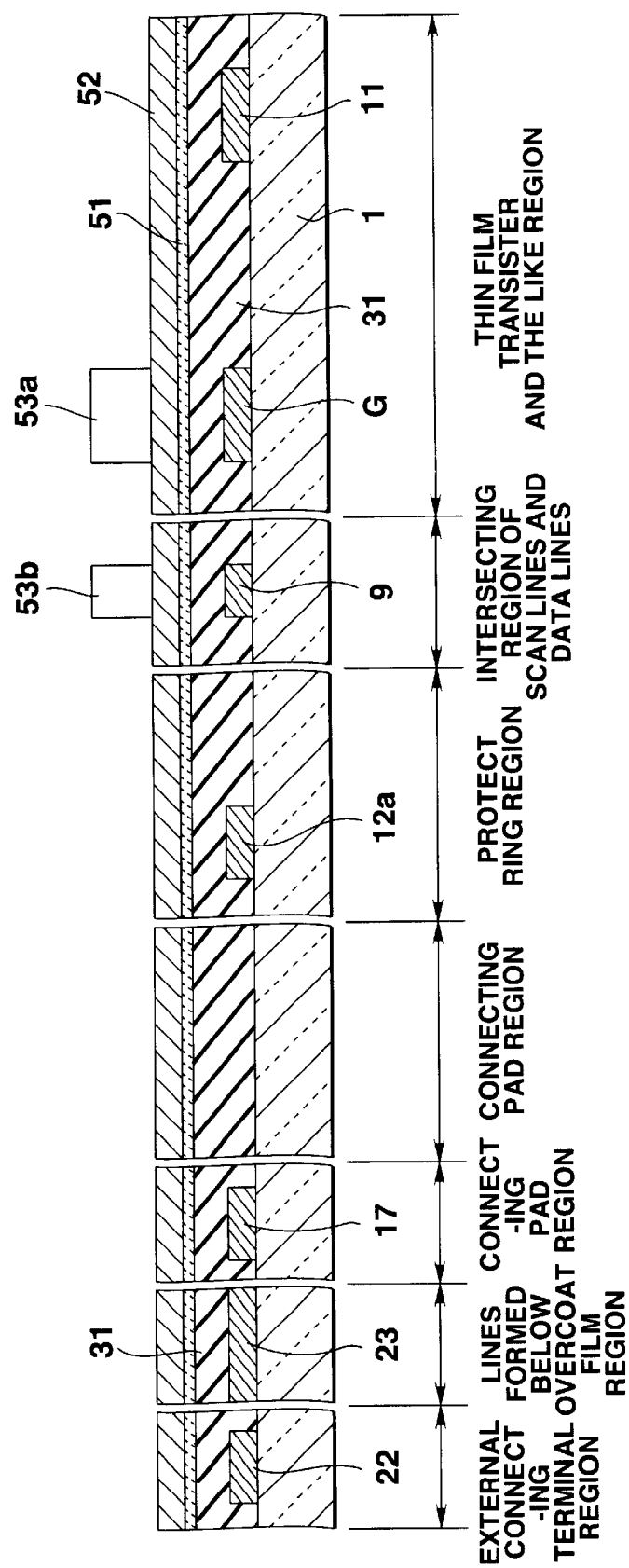
FIG. 3 is a sectional view showing a section in which a scan line and the like are formed by an Al-based metal film and a second photoresist film is formed by patterning after the formation of three films in steps S1 to S5 of FIG. 2.

FIG. 2 shows active matrix substrate fabrication steps in the first embodiment of the present invention. FIGS. 3 to 8 are sectional views showing the individual fabrication steps. To fabricate the active matrix substrate of this embodiment, in step S1 (metal film formation step) of FIG. 2, an Al-based metal film is formed on the upper surface of a glass plate (substrates) 1. In step S2 (first photoresist formation step), a first photoresist film is formed by patterning on the upper surface of this Al-based metal film. In step S3 (scan line and the like formation step), this first photoresist film is used as a mask to selectively etch the Al-based metal film. Consequently, as shown in FIG. 3, a gate electrode G for a thin film transistor 8, a scan line 9, a scan line connecting pad 17, an auxiliary capacitor line 11, edges 12a (the upper, lower, and right edges) of a protect ring 12, a line 23, and an external connecting pad 22 are formed of Al-based metal on the upper surface of each substrate of the glass plate 1. A short line 15, a connecting pad 25, and the like (none of them is shown in FIG. 3) shown in FIG. 1 are also formed. Note that the formation of the protective thin film transistors for protective elements 13 and 14 are substantially the same as the formation of the thin film transistor 8, so a detailed description thereof will be omitted.

Figure 4:
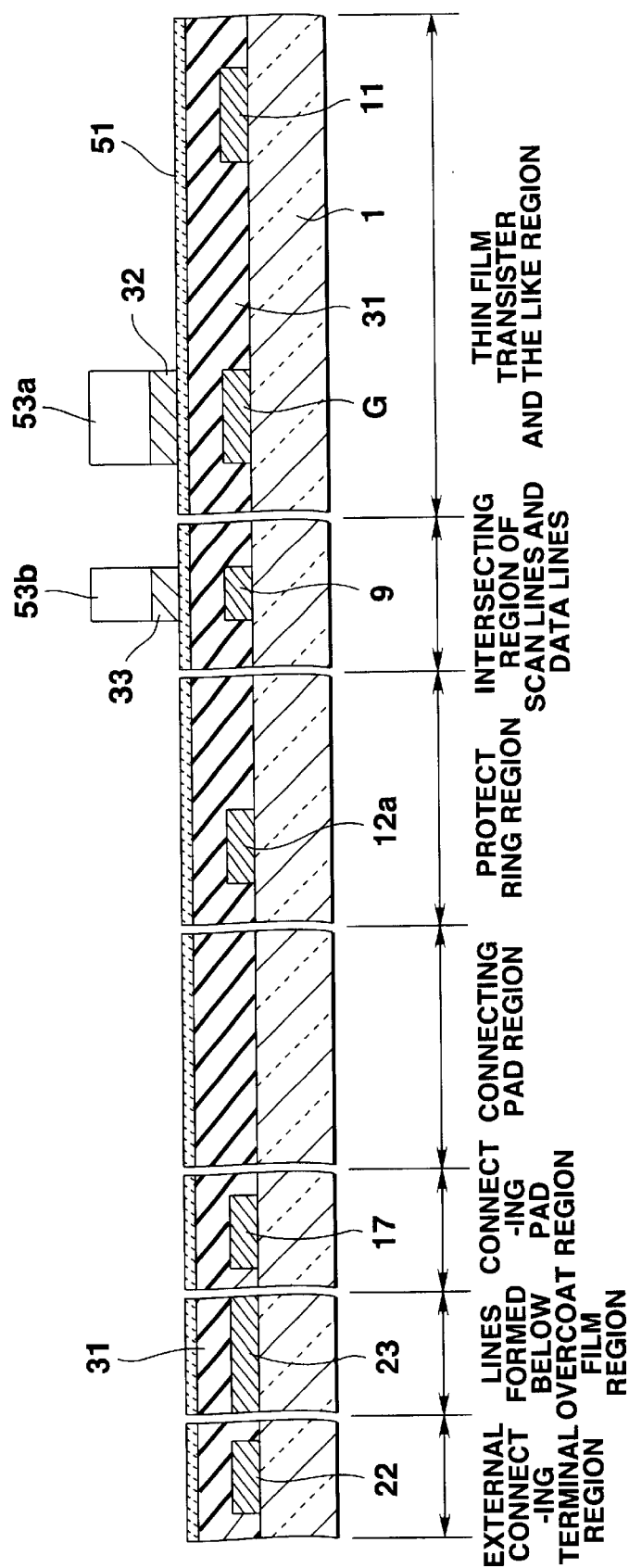
FIG. 4 is a sectional view showing a section in which a blocking layer is formed by patterning in step S6 of FIG. 2.

In step S4 (three film formation step), as shown in FIG. 3, a silicon nitride gate insulating film 31, an amorphous silicon semiconductor film 51, and a silicon nitride blocking layer formation film 52 are successively formed in this order on the upper surface of the glass plate 1. In step S5 (second photoresist formation step), the upper surface of this blocking layer formation film 52 is coated with a second photoresist film (not shown). After that, the resultant structure is exposed from its back side by using, e.g., the metal film of the gate electrode G for a thin film transistor 8 and the metal film of the scan line 9 as masks and also exposed from its front side by using a photomask (not shown). The structure is then developed to form patterns. Consequently, as shown in FIG. 3, an island-like second photoresist film 53a is formed by patterning on the upper surface of that portion of the blocking layer formation film 52, which is above the gate electrode G for a thin film transistor 8. Also, an island-like second photoresist film 53b is formed by patterning on the upper surface of that portion of the blocking layer formation film 52, which is above the region where the scan line 9 and a data line 10 are expected to intersect. Subsequently, in step S6 (blocking layer formation step), the second photoresist films 53a and 53b are used as masks to selectively etch the blocking layer formation film 52, thereby forming, as shown in FIG. 4, blocking layers 32 and 33 below the second photoresist films 53a and 53b, i.e., above the gate electrode G for a thin film transistor 8 and the region where the scan line 9 and a data line 10 are expected to intersect, respectively. After that, the resist films are removed.

Figure 5:
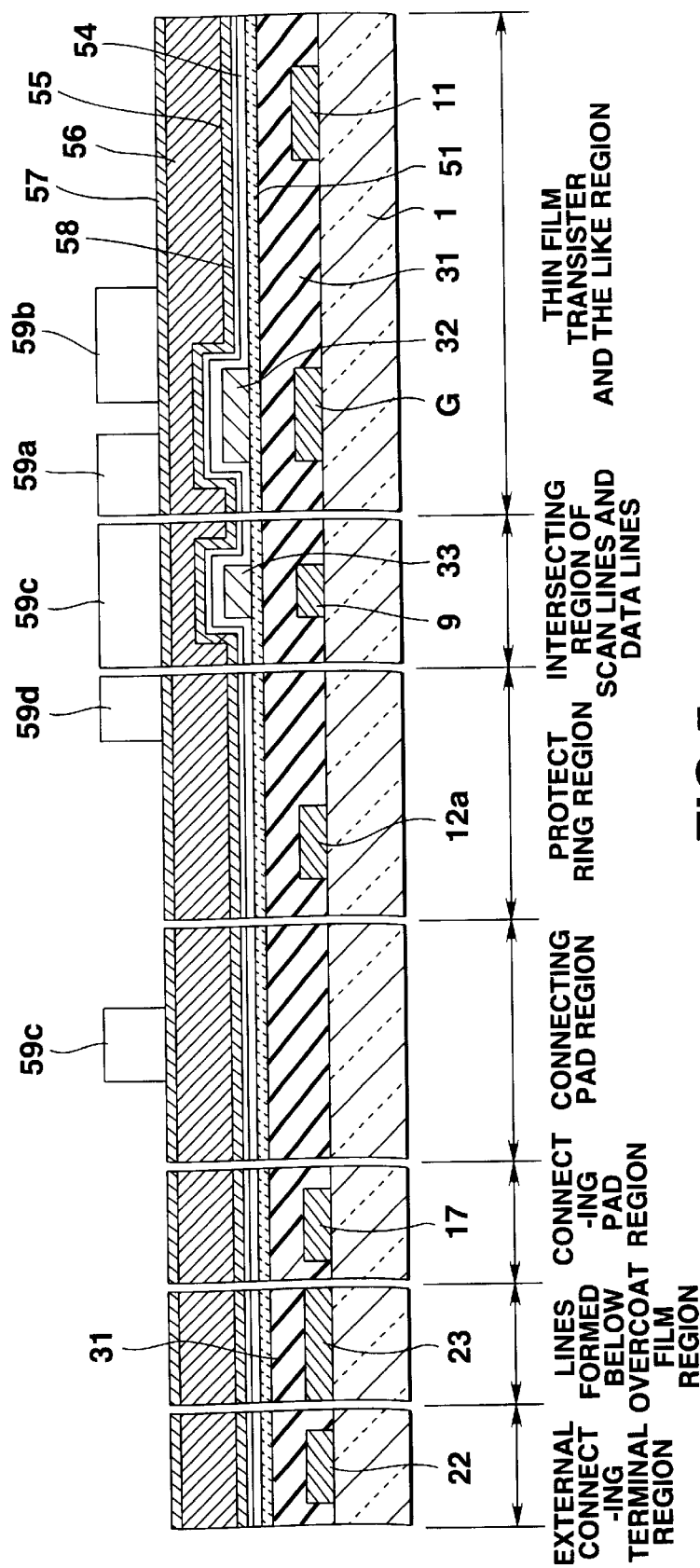
FIG. 5 is a sectional view showing a section in which an $n^+$-type silicon film is formed by plasma CVD or the like and a third photoresist film is formed by patterning after the formation of three films in steps S7 to S9 of FIG. 2.

In step S7 ($n^+$-type silicon film formation step), as shown in FIG. 5, an $n^+$-type silicon film 54 is formed on the upper surfaces of the semiconductor film 51 and the blocking layers 32 and 33 by plasma CVD or the like. In step S8 (three film formation step), as shown in FIG. 5, a Cr film 55, an Al-based metal film 56, and a Cr film 57 are successively formed in this order on the $n^+$-type silicon film 54. Since the lower Cr film 55 and the $n^+$-type silicon film 54 joint with each other, so that a Cr silicide film 58 is formed in the boundary between these two films.

Figure 6:
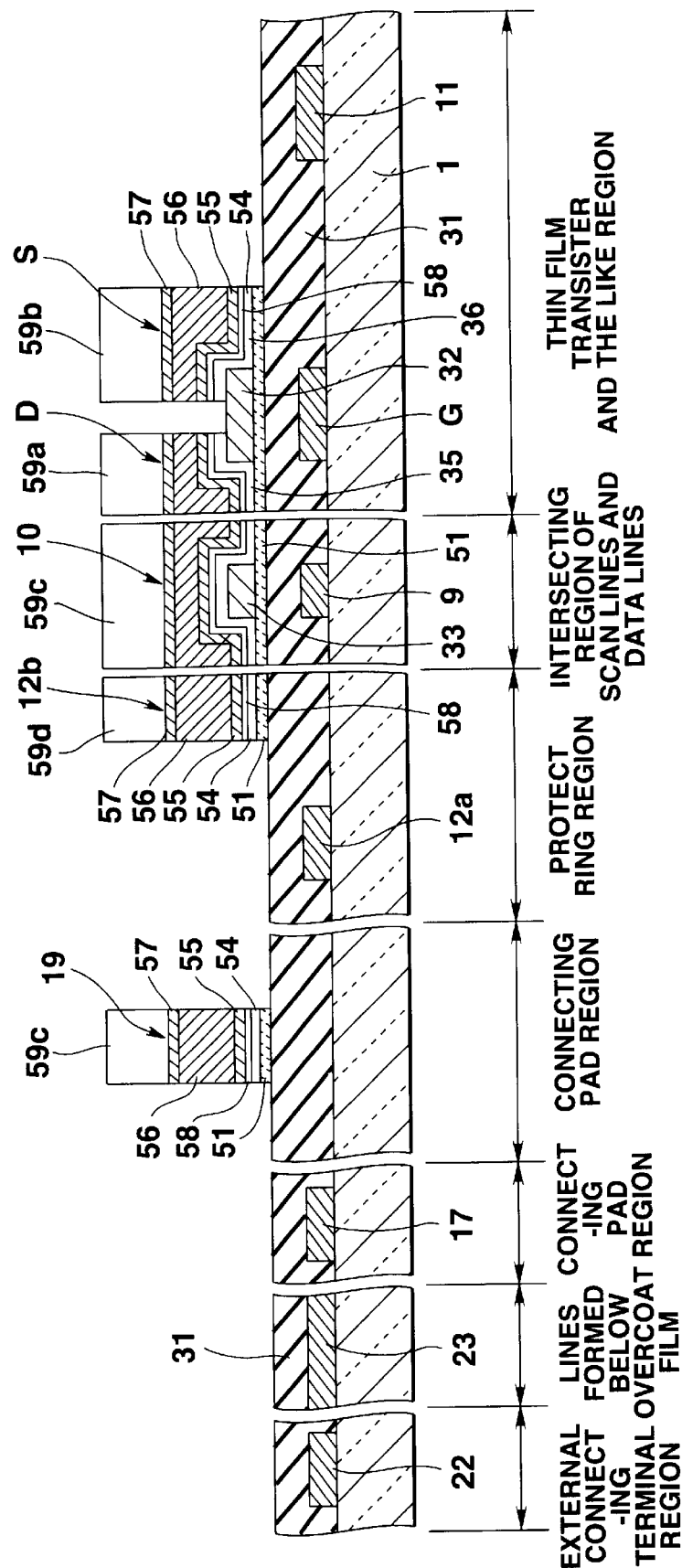
FIG. 6 is a sectional view showing a section in which a data line and a connecting pad are formed and a device area is formed by forming a Cr silicide film and an $n^+$-type silicon film by patterning in steps S10 and S11 of FIG. 2.

In step S9 (third photoresist formation step), the upper surface of the upper Cr film 57 is coated with a photoresist film (not shown), thereby forming by patterning, as shown in FIG. 5, third photoresist films 59a and 59b for forming, e.g., the drain electrode D and the source electrode S of the thin film transistor 8, a third photoresist film 59c for a data line 10 and a data line connecting pad 19, and a third photoresist film 59d for forming the left edge of a protect ring 12. In step S10 (data line and the like formation step), these third photoresist films 59a to 59d are used as masks to selectively etch the Cr film 57, the Al-based metal film 56, and the Cr film 55 in the order named. In step S11 (device area formation step), the third photoresist films 59a to 59b are again used as masks to selectively etch the Cr silicide film 58, the $n^+$-type silicon film 54, and the semiconductor film 51. Consequently, as shown in FIG. 6, a data line 10 and a data line connecting pad 19 are formed. Each of the data line 10 and the data line connecting pad 19 has a six-layered structure including the amorphous silicon semiconductor film 51, the $n^+$-type silicon film 54, the Cr silicide film 58, the Cr film 55, the Al-based metal film 56, and the Cr film 57 formed in this order from the plate 1. Also, a left edge 12b of the protect ring 12 is formed in a protect ring 12 connecting region. This left edge 12b for the protect ring 12 has the same six-layered structure as the data line 10. In the thin film transistor 8 and the like region, $n^+$-type silicon films 35 and 36 on the drain and source sides, respectively, are formed on the upper surface of the amorphous silicon semiconductor film 51 and on the two sides of the upper surface of the blocking layer 32. The Cr silicide film 58 is formed on these upper surfaces. In addition, a drain electrode D and a source electrode S each constructed of three layers, i.e., the Cr film 55, the Al-based metal film 56, and the Cr film 57, are formed on the upper surface of this Cr silicide film 58. That is, each of the drain electrode D and the source electrode S has a six-layered structure including the amorphous silicon semiconductor film 51, the $n^+$-type silicon film 54, the Cr silicide film 58, the Cr film 55, the Al-based metal film 56, and the Cr film 57 formed in this order from the plate 1.

Figure 7:
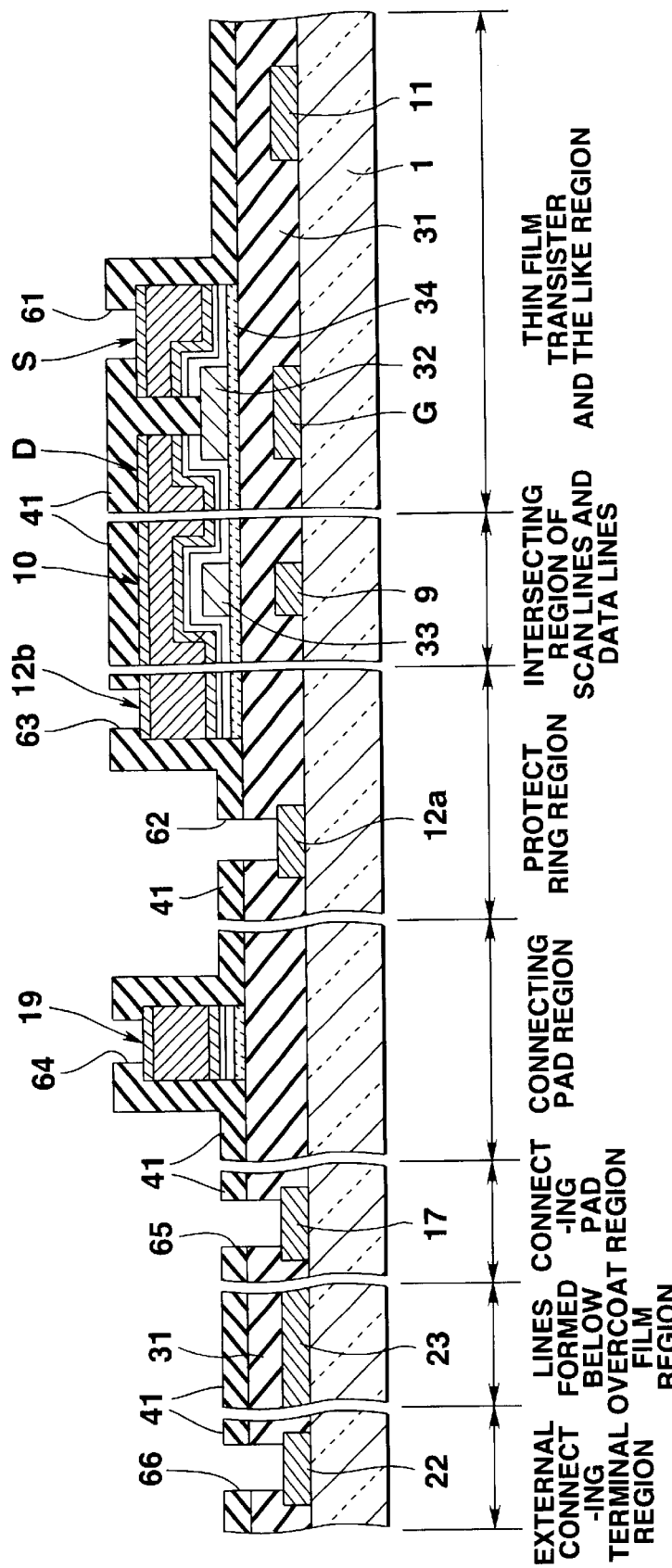
FIG. 7 is a sectional view showing a section in which an overcoat film is formed and contact holes are formed in steps S12 to S14 of FIG. 2.

In step S12 (overcoat film formation step), a silicon nitride overcoat film 41 is formed as shown in FIG. 7. In step S13 (fourth photoresist formation step), a fourth photoresist film (not shown) is formed on the upper surface of this overcoat film 41. In step S14 (contact hole formation step), this fourth photoresist film is used as a mask to etch the overcoat film 41 and the gate insulating film 31, thereby forming contact holes 61 to 66 in predetermined portions as shown in FIG. 7. That is, in the thin film transistor 8 and the like region, the contact hole 61 is formed in that portion of the overcoat film 41, which corresponds to the source electrode S. In the protect ring 12 connecting region, the contact hole 63 is formed in that portion of the overcoat film 41, which corresponds to a predetermined portion of the edge 12b for a protect ring 12. Also, the contact hole 62 extending through the overcoat film 41 and the gate insulating film 31 is formed in those portions of the overcoat film 41 and the gate insulating film 31, which correspond to a predetermined portion of the edge 12a for a protect ring 12a. In a data line connecting pad 12 region, the contact hole 64 is formed in that portion of the overcoat film 41, which corresponds to the connecting pad 19. In a scan line connecting pad 17 region, the contact hole 65 extending through the overcoat film 41 and the gate insulating film 31 is formed in those portions of the overcoat film 41 and the gate insulating film 31, which correspond to the connecting pad 17. In an external connecting terminal 22 region, the contact hole 66 extending through the overcoat film 41 and the gate insulating film 31 is formed in those portions of the overcoat film 41 and the gate insulating film 31, which correspond to the external connecting terminal 22. Thereby, the scan line connecting pad 17 and the external connecting terminal 22 formed of Al-based metal are exposed through the contact holes 65 and 66.

In step S15 (ITO film formation step), an ITO film for forming pixel electrodes is formed. In step S16 (fifth photoresist formation step), a fifth photoresist film (not shown) is formed on the upper surface of this ITO film. In step S17 (pixel electrode and the like formation step), this fifth photoresist film is used as a mask to dry-etch the ITO film to form patterns. If wet etching is used in this step, the scan line connecting pad 17 and the external connecting terminal 22 made of an Al-based metal and exposed in the contact holes 65 and 66, respectively, the ITO film, and an ITO etching solution come into contact with each other.

Figure 8:
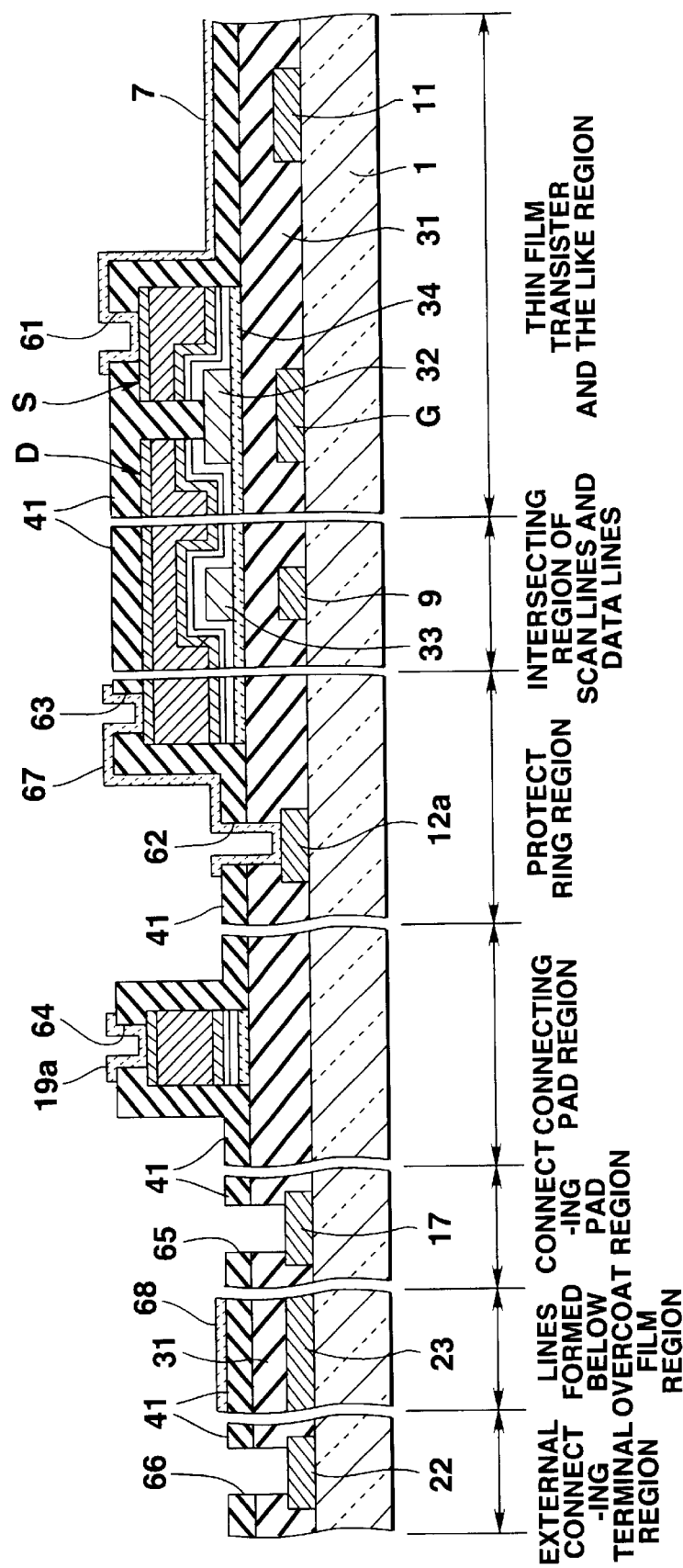
FIG. 8 is a sectional view showing a section in which an ITO film, a pixel electrode, and a connecting line between a protective thin film transistor and a protect ring are formed in steps S15 to S17 of FIG. 2.

Consequently, an Al-ITO cell reaction occurs to produce an oxidation-reduction potential difference. A current generated by this potential difference oxidizes the scan line connecting pad 17 and the external connecting terminal 22 and reduces the ITO film and thereby violently corrodes these components. In contrast, no such phenomenon takes place when dry etching is performed. Therefore, dry etching is used in this step. In this step, as shown in FIG. 8, in the thin film transistor 8 and the like region, a pixel electrode 7 is formed in a predetermined portion of the upper surface of the overcoat film 41 so as to be connected to the source electrode S of the thin film transistor 8 via the contact hole 61. In the protect ring 12 connecting region, a jumper line 67 made of an ITO film is formed in a predetermined portion of the upper surface of the overcoat film 41. One end of this jumper line 67 is connected to the edge 12a for a protect ring 12 via the contact hole 62. The other end of the jumper line 67 is connected to the edge 12b for a protect ring 12 via the contact hole 63. Consequently, the edges 12a and 12b of the prospective protect ring are connected to each other. In the connecting pad 19 region, a connecting pad 19a made of an ITO film is formed in a predetermined portion of the upper surface of the overcoat film 41 so as to be connected to the connecting pad 19 via the contact hole 64. This connecting pad 19a improves contact with the output terminal of a data line driving semiconductor chip to be connected thereto. However, the connecting pad 19a is not necessarily formed. Furthermore, the portions of the ITO film which are formed on the scan line connecting pad 17 and the external connecting terminal 22 when the pixel electrode 7, the jumper line 67, and the connecting pad 19a are formed, are removed. As a result, the scan line connecting pad 17 and the external connecting terminal 22 formed of Al-based metal are exposed through the contact holes 65 and 66. In the line 23 region, a line passivation film 68 is formed on the overcoat film 41 above the line 23. That is, an ITO line passivation film 68 is formed on the overcoat film 41 above the line 23 made of Al-based metal.

Accordingly, even if the overcoat film 41 and the gate insulating film 31 above the line 23 have a defect for some reason, the line passivation film 68 exists on this defective portion. As a consequence, the ITO etching solution used in the formation of the pixel electrode 7 does not soak its way into the defective portion in the overcoat film 41 and the gate insulating film 31. This protects the Al-based metal line 23 from breaking by the Al-ITO cell reaction, and the yield improves accordingly. Additionally, the line passivation film 68 is formed at the same time the pixel electrode 7 is formed by using the same material as the pixel electrode 7. This prevents an increase in the number of fabrication steps. Also, the line passivation film 68 can prevent atmospheric moisture from soaking its way into the defective portion in the overcoat film 41 and the gate insulating film 31. This protects the Al-based metal line 23 from breaking by corrosion.

The formation position of this line passivation film 68 is not limited to the portion above the line 23. For example, in the scan line 9 formation region 9a in the non-display region 6, the ITO line passivation film 68 can be formed on the overcoat film 41 on the Al-based metal scan line 9.

The active matrix substrate of this first embodiment is formed through the above steps.

Figure 9:
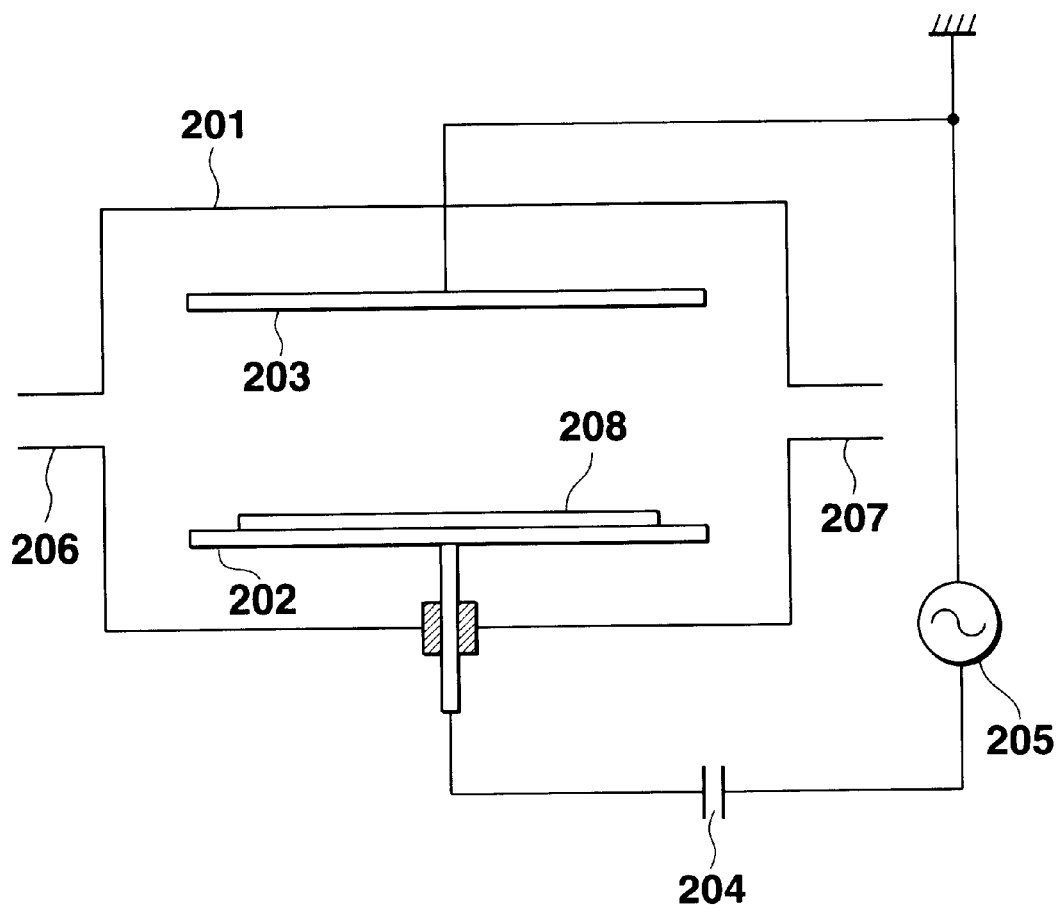
FIG. 9 is a diagrammatic view of a reactive ion etching (RIE) apparatus for use in patterning of an ITO film in step S17 in FIG. 2.

A method of satisfactorily performing dry etching the above ITO film will be explained. FIG. 9 is a diagrammatic view of a reactive ion etching (RIE) apparatus for use in dry etching of the ITO film.

This reactive ion etching (RIE) apparatus is of a cathode coupling type, and has a reaction vessel 201. In a lower region in the reaction vessel 201, a lower electrode plate 202 serving as a cathode is provided, and connected to an RF power supply 205 via a blocking capacitor 204. In an upper region in the reaction vessel 201, an upper electrode plate 203 serving as an anode is provided, and grounded. At a left portion of the reaction vessel 201, a gas introducing port 206 is provided, and at a right portion of the reaction vessel 201, a gas exhaust port 207 is provided. The gas introducing port 206 is connected to gas supplying means (not shown) for supplying a mixed gas of a hydriodic acid gas (hydrogen halide gas) and a helium gas (inert gas).

A glass substrate on which a photoresist film is formed on the ITO film subjected to the above step S17 (the pixel electrode and the like formation step) is placed as a sample 208 on the lower electrode plate 202.

In the reactive ion etching (RIE) apparatus, dry etching is performed on the ITO film of the sample 208 in the following manner:

First of all, after the sample 208 is placed on the lower electrode plate 202 in the reactive vessel 201, the gas in the reactive vessel 201 is discharged through the gas exhaust port 207, thereby making the reactive vessel 201 vacuum.

Next, the mixed gas of a hydriodic acid gas (HI) and a helium gas (He) supplied from the gas supplying means is introduced from the gas introducing port 206 into the reactive vessel 201. Then, an RF power is applied from the RF power supply 205 to the lower electrode plate 202, for generating ions. Thus, the ITO layer of the sample 208 is etched.

Figure 10:
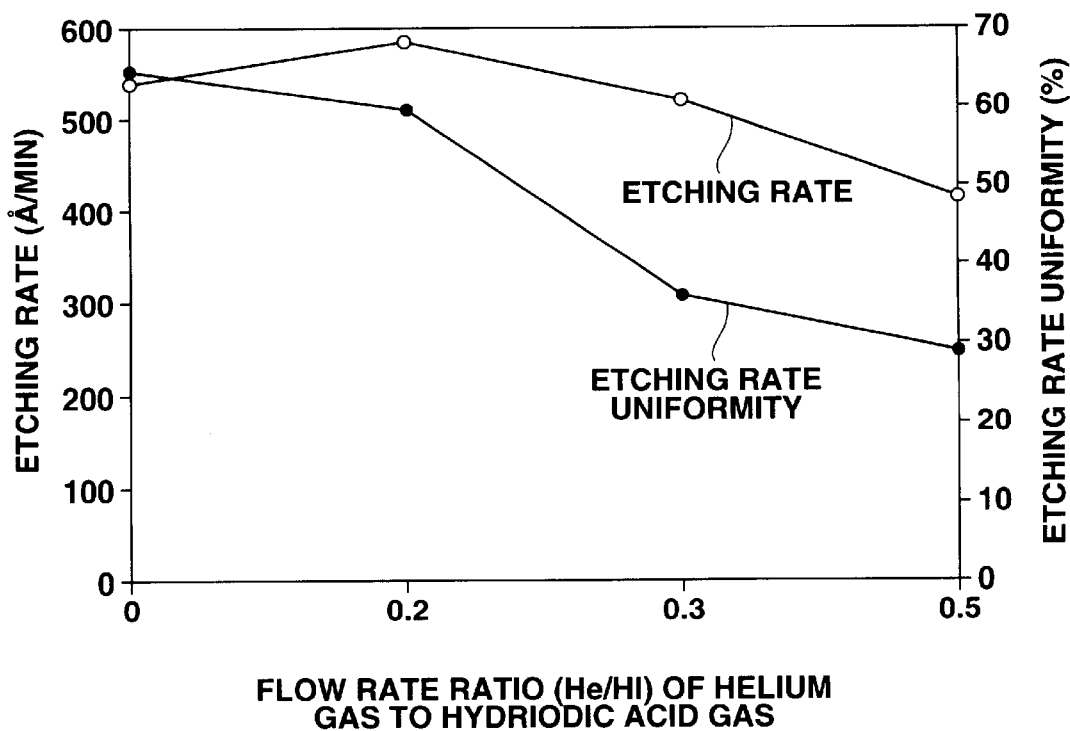
FIG. 10 is a graph showing a relationship between the flow rate ratio of a helium gas to a hydriodic acid gas and an etching rate and an etching rate uniformity in the reactive ion etching (RIE) apparatus shown in FIG. 9.

FIG. 10 shows the etching rate and the etching rate uniformity of the ITO layer of the sample 208 which are obtained when the inner pressure of the reactive vessel 201 is set at 3 Pa, a high frequency of RF power 2.4 KW and 13.56 MHz is applied from the RF power supply 205, the total flow rate of the mixed gas is set at 200 ccm, and the flow rate ratio (He/HI) of the helium gas to the hydriodic acid gas is changed. In FIG. 10, white circles indicate the etching rate, and black circles indicate the etching rate uniformity. It should be noted that the etching rate uniformity is represented by a value expressed by the formula "(E1−E2)/(E1+E2)×100%", where E1 is the maximum value of the etching rate, and E2 is the minimum value of the etching rate, and the above value indicates that the etching rate uniformity becomes higher as the value decreases.

According to FIG. 10, when the flow rate ratio (He/HI) obtained when only the hydriodic acid gas is used as dry etching gas is 0, the etching rate is 550 Å/min, which is desirable, but the value representing the etching rate uniformity is approximately 65%, which is not desirable. That is, when only the hydriodic acid gas is used as the dry etching gas, a high etching rate can be obtained, but the etching rate uniformity is not satisfied. On the other hand, in the case where the mixed gas of a hydriodic acid gas and a helium gas is used, the etching rate and the etching rate uniformity, as shown in FIG. 10, can be obtained in the following manner: when the flow rate ratio (He/HI) is 0.2, the etching rate is the maximum (approximately 590 Å/min), and when the flow rate ratio (He/HI) is more than 0.2 or less than 0.2, the etching rate gradually decreases; however, when the flow rate ratio (He/Hi) is 0.5, the etching rate is 400 Å/min or more, which is desirable. On the other hand, the value representing the etching rate uniformity decreases, i.e., the etching rate uniformity becomes higher, as the flow rate ratio (He/HI) increases. In particular, it should be noted that the etching rate uniformity rapidly becomes high when the flow rate ratio (He/HI) is 0.2 or more. It can be considered that the non-uniform etching rate of the reactive ion etching due to hydriodic acid gas ions on the ITO layer is complemented by a physical sputtering effect of applied helium gas ions, thus uniformalizing the etching rate. In this case, it is estimated from FIG. 10 that when the flow rate ratio (He/HI) is more than 0.5 which is not shown, the etching rate is 400 Å/min or less, and is relatively small.

The value representing the etching rate uniformity rapidly decreases when the flow rate ratio (He/HI) is 0.2 or more. That is, in this case, the etching rate uniformity becomes satisfactory. Thus, it is preferable that the flow rate ratio (He/HI) of the mixed gas be 0.2 to 0.5.

Furthermore, as is clear from FIG. 10, when the flow rate ratio (He/HI) is 0.3, the etching rate is about 520 Å/min, and is relative great, and the value representing the etching rate uniformity is about 35%, and is relative small. Accordingly, it is more preferable that the flow rate ratio (He/HI) be about 0.3.

Figure 11:
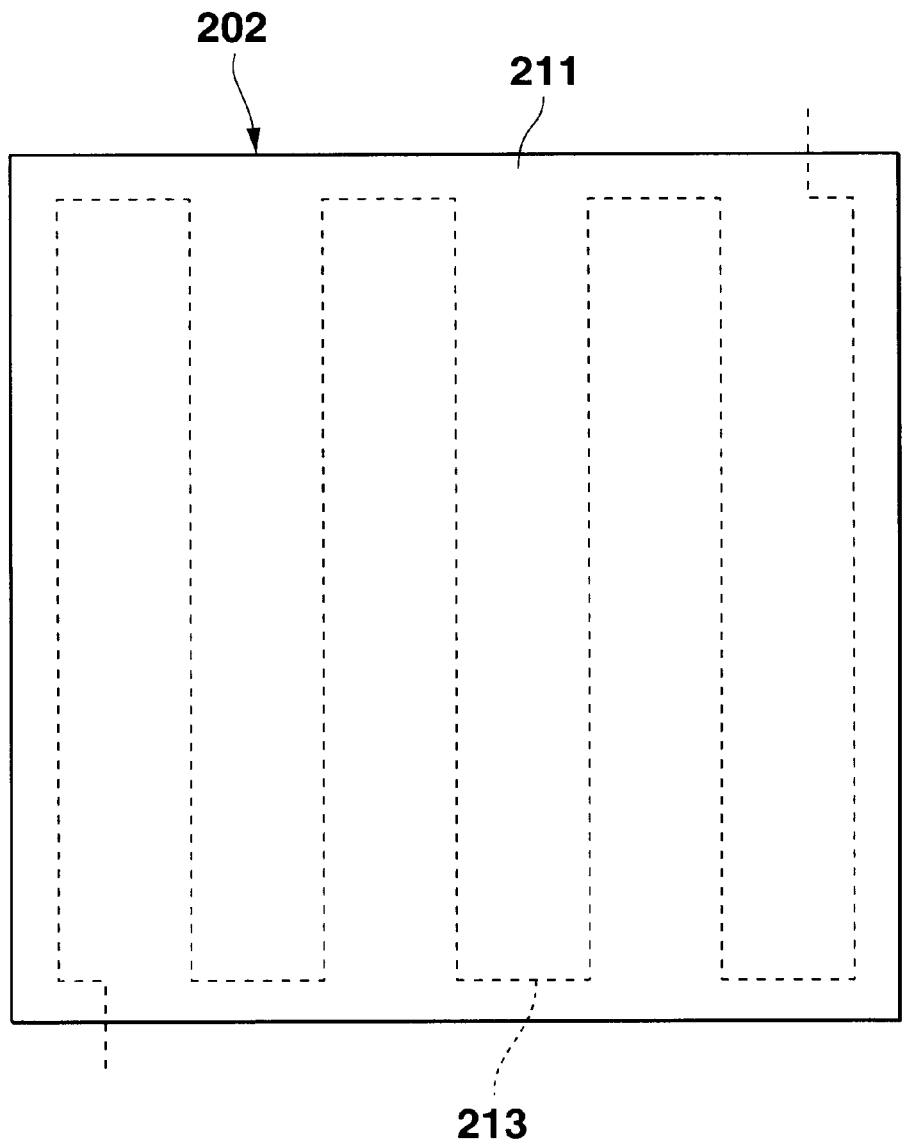
FIG. 11 is a plan view showing the first example of a lower electrode plate in the reactive ion etching (RIE) apparatus in FIG. 9.
Figure 12:
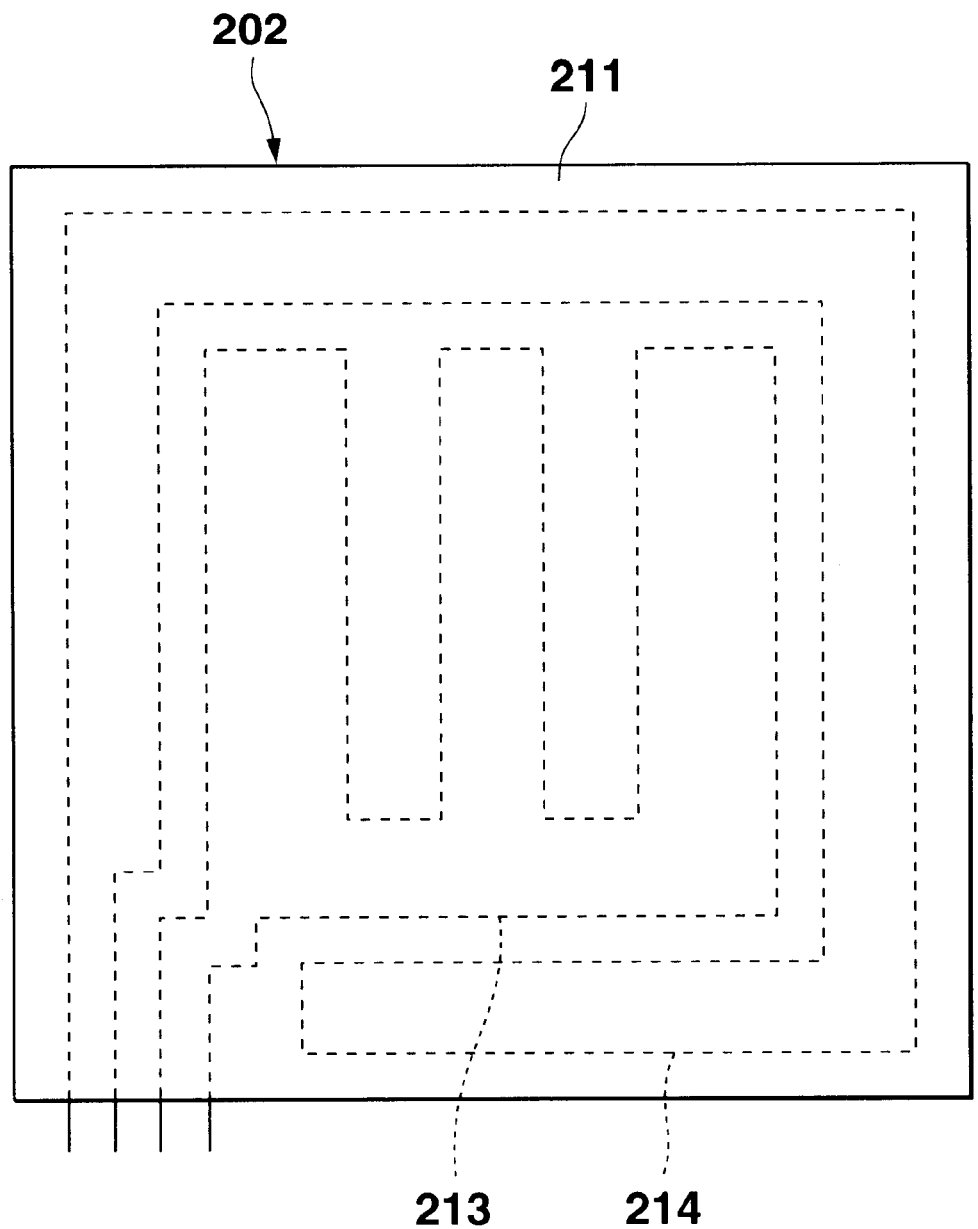
FIG. 12 is a plan view showing the second example of the lower electrode plate in the reactive ion etching (RIE) apparatus in FIG. 9.

Next, the etching rate, the etching rate uniformity, and the substrate temperature which varies with the passage of time will be explained as set out below, with respect to the case where the substrate temperature of the sample 208 is set at 80° C. by using an electrode plate 211 shown in FIG. 11 as the lower electrode plate 202, and the case where the substrate temperature of the sample 208 is set by using an electrode plate 211 shown in FIG. 12 such that the temperature of the center portion is at 80° C., and that of the peripheral portion is at 110° C. The electrode plate 211 shown in FIG. 11 is provided such that one pipe, i.e., a pipe 212 is provided in a snaky manner (one-system substrate temperature adjusting mechanism), and a heat medium (Galden) is introduced into the pipe 212. The electrode plate 211 shown in FIG. 12 is provided such that a pipe 213 is provided at the center portion in a snaky manner, another one pipe, i.e., a pipe 214 is provided at the peripheral portion (two-system substrate temperature adjusting mechanism), and a heat medium (Galden) is introduced into the pipes 213 and 214. Due to this structure, the substrate temperatures of the center and peripheral portions of the sample 208 can be set. Furthermore, the flow rate of a hydriodic acid gas (HI) is set at 175 ccm, that of a helium gas (He) is set at 50 ccm, the inner pressure of the reactive vessel 201 is set at 6 Pa, and a high frequency having RF power of 2.5 KW 13.56 MHz is supplied from the RF power supply 205.

As a result, in the case of using the lower electrode plate 202 having the one-system substrate temperature adjusting mechanism shown in FIG. 11, the etching rate is approximately 700 Å/min, and the value representing the etching rate uniformity is approximately 35%. On the other hand, in the case of using the lower electrode plate 202 having the two-system substrate temperature adjusting mechanism shown in FIG. 12, the etching rate is about 900 Å/min, and the value representing the etching rate uniformity is approximately 15%.

Figure 13:
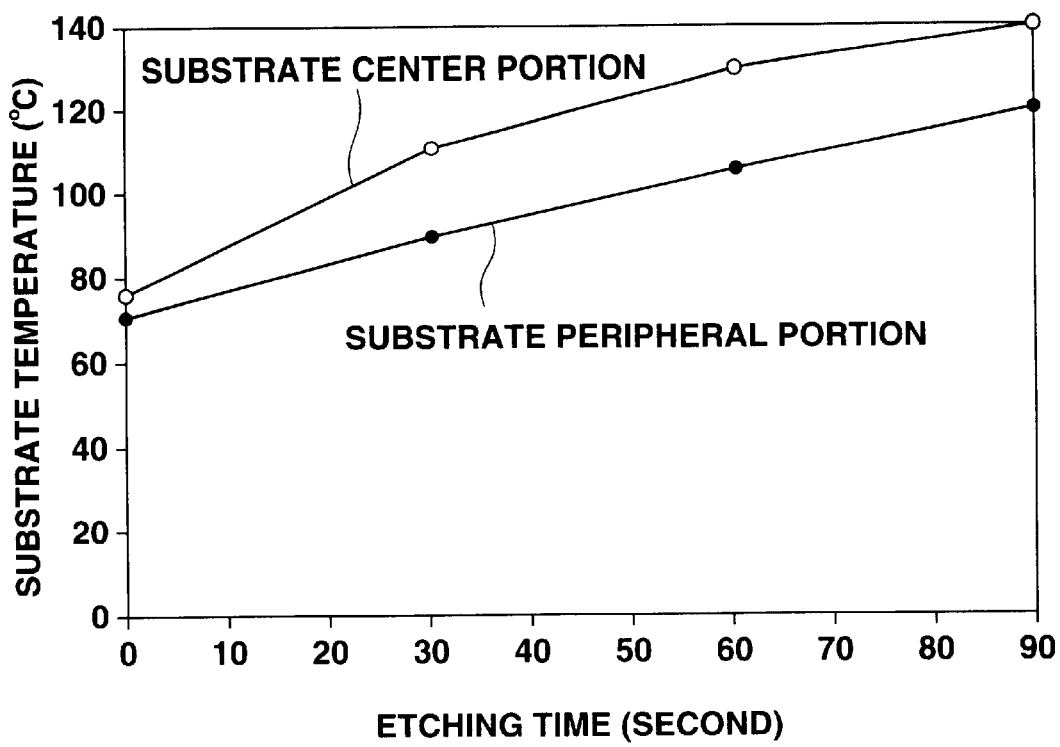
FIG. 13 is a graph showing a substrate temperature which varies with the passage of time in the case where the lower electrode plate shown in FIG. 11 is used in the reactive ion etching (RIE) apparatus in FIG. 9.
Figure 14:
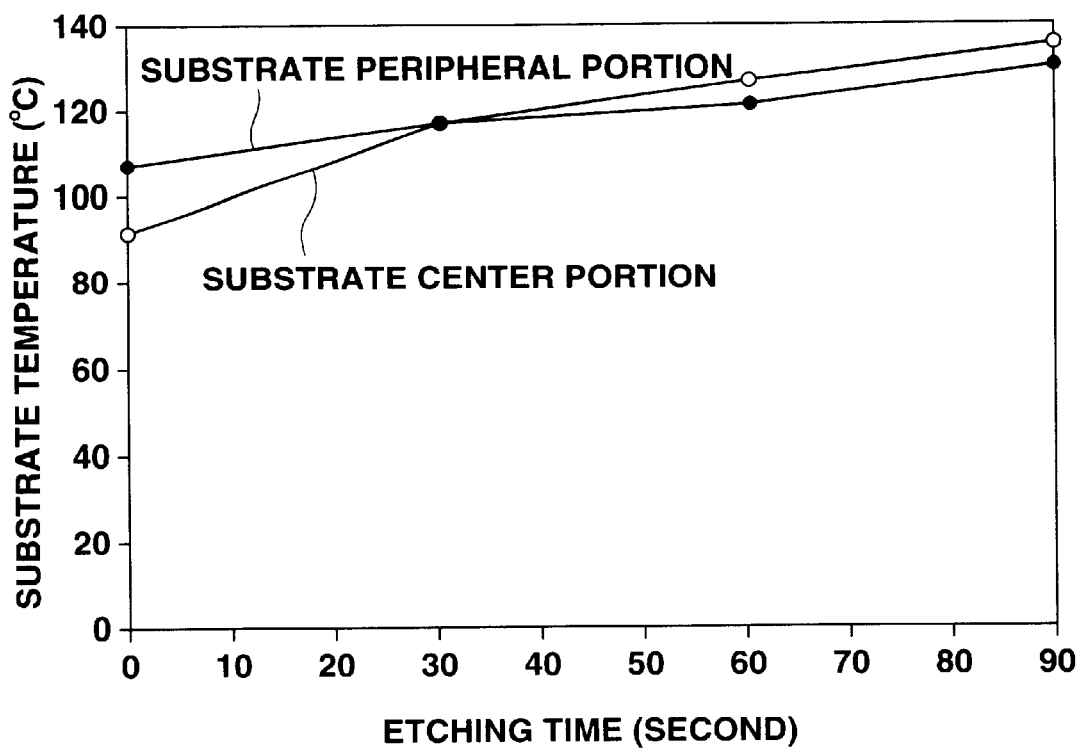
FIG. 14 is a graph showing a substrate temperature which varies with the passage of time in the case where the lower electrode plate shown in FIG. 12 is used in the reactive ion etching (RIE) apparatus in FIG. 9.

Moreover, FIG. 13 shows the substrate temperature which varies with the passage of time in the case of using the lower electrode pate 202 having the one-system substrate temperature adjusting mechanism shown in FIG. 11, and FIG. 14 shows the substrate temperature which varies with the passage of time in the case of using the lower electrode plate 202 having the two-system substrate temperature adjusting mechanism shown in FIG. 12. It should be noted that white circles indicate the temperature of the center portion of the substrate, and black circles indicate that of the peripheral portion of the substrate. In addition, actually, the etching time period (RF power-applying time period) is approximately 60 seconds.

As shown in FIG. 13, in the case of using the lower electrode plate 202 having the one-system substrate temperature adjusting mechanism shown in FIG. 11, the temperature of the center portion of the substrate is entirely higher than that of the peripheral portion of the substrate. In the case of using the lower electrode plate 202 having the two-system substrate temperature adjusting mechanism shown in FIG. 14, the temperature of the center portion of the substrate which is indicated by the white circles is substantially equal to that of the peripheral portion of the substrate which is indicated by the black circles.

That is, it can be considered that the difference between the etching rate (700 Å/min) and the value (35%) of the etching rate uniformity in the case of using the lower electrode plate 202 having the one-system substrate temperature adjusting mechanism shown in FIG. 11 and the etching rate (900 Å/min) and the value (15%) of the etching rate uniformity in the case of using the lower electrode plate 202 having the two-system substrate temperature adjusting mechanism shown in FIG. 12 is made due to the substrate temperature and the temperature difference between the center portion and the peripheral portion of the substrate.

When the ITO film of the sample 208 is dry-etched, it is preferable that the temperature substrate be set such that the temperature of the peripheral portion is higher than that of the center portion. In addition, in the above example, the difference between the set temperature of the center portion and that of the peripheral portion is 30° C.; however, it is preferable that the difference between those set temperatures be 20 to 30° C.

Furthermore, it is desirable that the set temperature of the peripheral portion (which is 110° C. in the above example) be equal to or less than a post-bake temperature (e.g., 110° C.) of the photoresist formed on the ITO film. If it is so, the removability of the resist is improved.

When the reactive ion etching (RIE) apparatus having the above structure is used, the ITO film formed on the glass substrate can be uniformly etched at a high etching rate.

In the active matrix substrate fabrication method of this first embodiment, in step S14 (contact hole formation step) one photoresist film is used to simultaneously form contact holes extending through the overcoat film and contact holes extending through the overcoat film and the gate insulating film. Accordingly, the following portions can be formed by the same transparent conductive film (ITO film) as a pixel electrode.

(1) The jumper line 67 for connecting the disconnected portions (the upper, lower, and right edges 12a formed simultaneously with the scan line and the left edge 12b formed simultaneously with the data line) of the protect ring 12.
(2) The surface layer 19a of the data line connecting pad 19.
(3) The line passivation film 68 on the overcoat film above the line.

Since, therefore, these portions (1), (2), and (3) can be formed simultaneously with the pixel electrode 7, the number of fabrication steps can be decreased accordingly. That is, in the fabrication process shown in FIG. 2, photoresist films are formed to form patterns by using photomasks in the following steps.

(1) Formation of the scan lines and the like in steps S1 and S2.
(2) Formation of the blocking layer in steps S5 and S6.
(3) Formation of the data lines and like and formation of the device area by removal of unnecessary portions of the semiconductor film and the like in steps S9, S10, and S11.
(4) Formation of the contact holes in the overcoat film in steps S13 and S14.
(5) Formation of the pixel electrodes and the like in steps S16 and S17.

As described above, photoresist film formation steps are the above five steps, so photomasks are formed five times. Accordingly, since only five photomasks are necessary for the fabrication, the fabrication cost can be reduced. Additionally, the throughput improves because the number of fabrication steps can be reduced.

Figure 15:
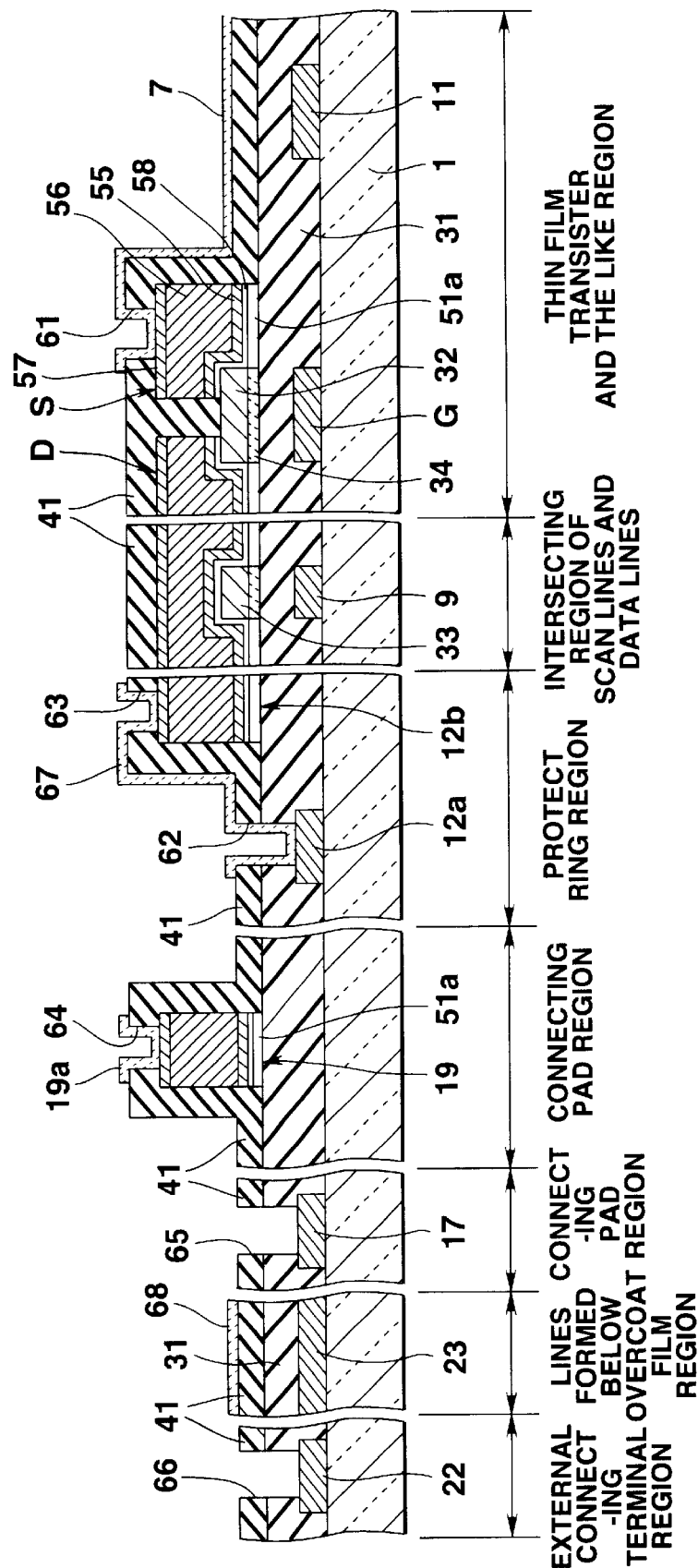
FIG. 15 is a sectional view of an active matrix substrate fabricated by a fabrication process of the second embodiment in which a step of forming an $n^+$-type silicon layer by ion doping is used instead of step S7 of forming an $n^+$-type silicon layer by plasma CVD or the like in the fabrication process of the first embodiment shown in FIG. 2.
Figure 18:
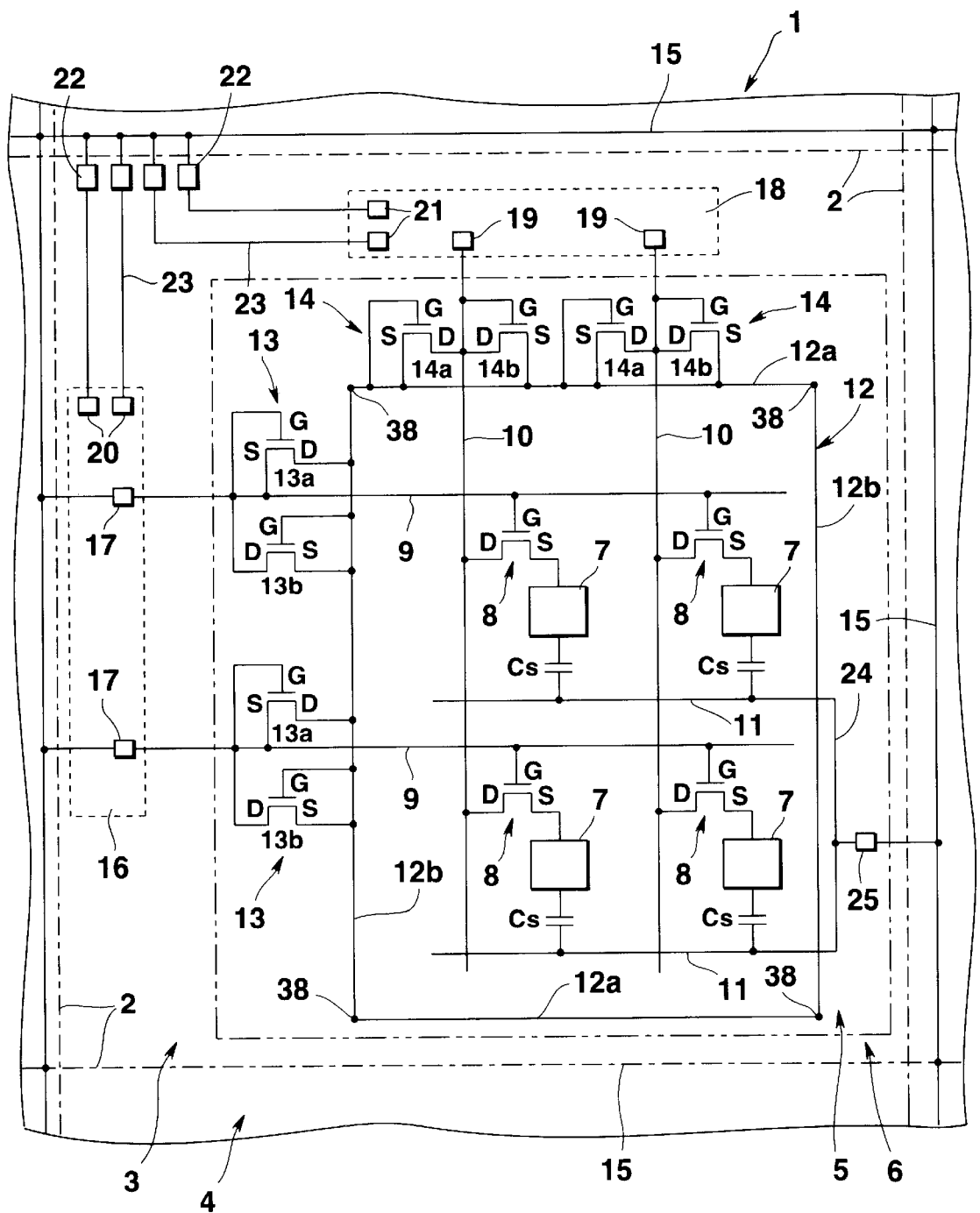
FIG. 18 is a circuit diagram showing an equivalent circuit plan view when a conventional active matrix substrate is formed on a substrate having a size corresponding to a plurality of such display panels.

Furthermore, in the above first embodiment, the method of film formation using plasma CVD or the like is used to form the $n^+$-type silicon film. However, ion doping can also be used to form the $n^+$-type silicon film. FIG. 15 is a sectional view according to the second embodiment of the present invention in which a step of forming the $n^+$-type silicon film by ion doping is used instead of step S7 of forming the $n^+$-type silicon film by plasma CVD or the like in the first embodiment shown in FIG. 2. In this second embodiment, each of a data line 10, a data line connecting pad 19, an edge 12b of a protect ring 12, a drain electrode D, and a source electrode S has a five-layered structure including an $n^+$-type silicon film 51a, a Cr silicide film 58, a Cr film 55, an Al-based metal film 56, and a Cr film 57 formed in this order from a plate 1. In the second embodiment, photoresist formation steps are the aforementioned five steps as in the first embodiment. Accordingly, the fabrication cost can be reduced, and the throughput improves because the number of fabrication steps can also be reduced.

The first and second embodiments have the effect of reducing the number of fabrication steps as described above. Additionally, the metal layer portions such as the source and drain electrodes of the thin film transistor and the data line have a three-layered structure including the Cr film 55, the Al-based metal film 56, and the Cr film 57. Since the surface layer of the source electrode S of the thin film transistor, which is to be connected to the pixel electrode is made of the Cr film 57 having a higher oxidation-reduction potential than that of the Al-based metal layer, the contact resistance between this source electrode S and the pixel electrode can be reduced. Also, the data line has the stacked structure including the Al-based metal film 56 and the Cr films 55 and 57 having a higher oxidation-reduction potential than that of the Al-based metal layer, so the resistance of this data line can be reduced. However, if the resistance of the data line may be high to some degree, each of the above members may be formed of a single Cr film. In addition, the present invention is not limited to the above embodiments, and each of the members may be formed of a single Al-based metal layer.

In the above first and second embodiments, Cr is used as the metal which has a higher oxidation-reduction potential than that of an Al-based metal. However, another metal, such as Ti, Ta, or Mo, can also be used as the metal which has a higher oxidation-reduction potential than that of an Al-based metal.

Furthermore, in the first and second embodiments, in the case where the three-layered metal portions such as the data line 10, the data line connecting pad 19, and the edge 12b of the protect ring 12, as mentioned above, are formed to have a structure in which the first layer and the third layer as the surface layer are made of a metal, such as Cr, having a higher oxidation-reduction potential than that of an Al-based metal layer and the second layer as the intermediate layer is made of an Al-based metal, the three-layered metal portions can be formed by patterning through steps shown in FIGS. 16A to 16E by using wet etching. Consequently, a data line and the like having high reliability can be formed as described below. To simplify explanation, three metal layers are formed directly on a gate insulating film. Although the three metal layers are formed on the semiconductor film in the first and second embodiments, the processing of the three metal layers can be considered to be the same.

First, as shown in FIG. 16A, a metal layer 102 as a first metal layer made of a metal, such as Cr, having a higher oxidation-reduction potential than that of an Al-based metal layer is formed on the upper surface of a gate insulating film 101 by sputtering or the like. An Al-based metal layer 103 as a second metal layer is formed on the upper surface of this metal layer 102 by sputtering or the like. A surface layer 104 made of a metal, such as Cr, having a higher oxidation-reduction potential than that of an Al-based metal layer is formed on the upper surface of the Al-based metal layer 103 by sputtering or the like. Next, the upper surface of this surface layer 104 is coated with a photoresist 105 to form a pattern having a predetermined shape. This photoresist 105 is used as a mask to wet-etch the surface layer 104 made of a metal such as Cr. The Al-based metal layer 103 is then wet-etched to form a shape as shown in FIG. 16B. That is, when the Al-based metal layer 103 is wet-etched, the two side surfaces of the Al-based metal layer 103 are also side-etched to form overhangs 104a of the overlying surface layer 104 on two sides of the upper surface of the Al-based metal layer 103. When the first metal layer 103 made of, e.g., Cr is wet-etched in this state, the overhangs 104a of the surface layer 104 are also etched away to form a shape as shown in FIG. 16C. This is obtained by the following action. That is, in the state shown in FIG. 16B, the surface area of the first metal layer 102 is much larger than the area of the side walls of the second Al-based metal layer 103. Therefore, the reaction between the etching solution for the first metal layer 102 made of, e.g., Cr and the first metal layer 102 is more dominant than the reaction between this etching solution and the side walls of the second Al-based metal layer 103. Hence, no negative electromotive force is generated in the overhangs 104a of the surface layer 104 when the first metal layer 102 is wet-etched. Consequently, the etching solution for the first metal layer 102 reacts with and removes the overhangs 104a of the upper surface layer 104. When the photoresist 105 is removed after that, a data line 110 having a shape shown in FIG. 16D is obtained. The width of the surface layer 104 of the data line 110 thus formed is smaller than the width of the bottom portion of the underlying second Al-based metal layer 103. As shown in FIG. 16E, therefore, when an overcoat film 111 made of, e.g., silicon nitride is formed to have a film thickness of about 200 nm on the upper surface, the data line 110 can be completely covered with this overcoat film 111. This improves the reliability.

In contrast, if the data line and the like are formed by two metal layers, e.g., a first Al-based metal layer and a second metal layer made of a metal, such as Cr, having a higher oxidation-reduction potential that that of an Al-based metal, the following problem arises as indicated by processing steps shown in FIGS. 17A to 17D. That is, as shown in FIG. 17A, an Al-based metal layer 102 as a first metal layer is formed on the upper surface of a gate insulating film 101. On the upper surface of this Al-based metal layer 102, a surface layer 103 as a second metal layer made of a metal, such as Cr, having a higher oxidation-reduction potential than that of an Al-based metal is formed by sputtering or the like. The upper surface of this surface layer 103 is coated with a photoresist 105 to form patterns. This photoresist 105 is used as a mask to wet-etch the surface layer 103 as a metal layer made of, e.g., Cr, thereby forming patterns. Subsequently, the underlying Al-based metal layer 102 is wet-etched to form a shape as shown in FIG. 17B. That is, when the Al-based metal layer 102 is wet-etched, the two side surfaces of this Al-based metal layer 102 are side-etched to form overhangs 103a of the surface layer 103 on two sides of the upper surface of the Al-based metal layer 102. When the photoresist 105 is removed in this state, a data line 110 having a shape as shown in FIG. 17C is formed. When an overcoat film 111 made of, e.g., silicon nitride is formed to have a film thickness of about 200 nm on the upper surface of this data line 110 to thereby cover the data line 110, a state shown in FIG. 17D results. That is, the overhangs 103a make the data line 110 difficult to completely cover with the overcoat film 111, producing uncovered portions or portions where the overcoat film 111 is very thin. The reliability lowers because an impurity or water enters from these portions. If etching is again performed by using an etching solution for the surface layer 103 to remove the overhangs 103a in the state shown in FIG. 17B, the etching solution for the surface layer 103 reacts with the side walls of the first Al-based metal layer 102 because the surface area of the overhangs 103a of the surface layer 103 is smaller than the area of the side walls of the first Al-based metal layer 102. This produces negative electromotive force in the overhangs 103a of the surface layer 103 to interfere with the reaction between the surface layer etching solution and the overhangs 103a of the surface layer 103. Consequently, the overhangs 103a remain without being etched. When oxygen plasma processing or plasma processing using a gas mixture of chlorine and oxygen is performed to remove the overhangs 103a in the state shown in FIG. 17B, the overhangs 103a can be etched away. However, this is unpreferable because the number of fabrication steps increases.

As described above, when the data line and the like are formed by two metal layers, the reliability lowers. This problem can be avoided when three metal layers are formed as described previously. By using these fabrication steps, the reliability can be ensured when the data line is formed by a multilayered structure.

The surface layer 103 is formed simultaneously with the surface layer of the source electrode S of the thin film transistor to be connected to the pixel electrode and need only have a film thickness by which the contact with the pixel electrode improves. Therefore, the film thickness can be about 2.5 nm or more. Also, this film thickness is preferably about 150 nm or less in order to cover the surface layer 103 with the overcoat film as described earlier. The film thickness of the first metal layer 102 can be the same as the surface layer 103. However, this film thickness is preferably larger in order to improve the contact between the first metal layer of the drain electrode D and the source electrode S formed simultaneously with the metal layer 102 and the n⁺-type silicon layer in the source, drain region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating an active matrix substrate, comprising:

forming a line layer of an Al-based metal film on a substrate;

forming an insulating film covering the line layer;

forming at least one contact hole which extends through the insulating film on the line layer, and exposes at least a part of the line layer;

forming an ITO film on the insulating film and said at least the part of the line layer which is exposed by the contact hole; and patterning the ITO film by performing dry etching with reactive ion etching using a mixed gas of a hydrogen halide gas and an inert gas, thereby removing at least a part of that portion of the ITO film which is formed on said at least the part of the line layer to expose that part of the line layer, and forming a transparent electrode layer on the insulating layer, the transparent electrode layer being formed of a part of the ITO film;

wherein the hydrogen halide gas is a hydriodic acid gas, and the inert gas is a helium gas; and wherein a flow rate ratio of the helium gas to the hydriodic acid gas is 0.2 to 0.5.

2. A method according to claim 1, wherein a temperature of the substrate when the ITO film is dry-etched is set such that a temperature of a peripheral portion of the substrate is higher than that of a center portion thereof.

3. A method according to claim 2, wherein a difference between the temperatures of the center portion and the peripheral portion is 20 to 30° C.

4. A method according to claim 2, wherein a photoresist is formed on the ITO film, when the ITO film is dry etched, and the temperature of the peripheral portion of the substrate when the ITO film is dry-etched is equal to or less than a post-bake temperature of the photoresist.

5. A method according to claim 1, wherein the active matrix substrate comprises a plurality of lines each constituted by a single metal layer formed under the insulating film, and wherein a plurality of line protective films are formed of parts of the ITO film such that the line protective films are provided on the insulating film and insulated from the lines formed under the insulating film, and such that the line protective films are respectively associated with the lines formed under the insulating film.

6. A method according to claim 1, wherein the active matrix substrate comprises a plurality of active elements arranged in a matrix, the line layer is coupled to the active elements, and the transparent electrode layer is connected to the active elements.

7. A method according to claim 6, wherein:

each of the active elements of the active matrix substrate includes a thin film transistor having a source electrode and a drain electrode;

the insulating film is formed of an overcoat film and a gate insulating film of the thin film transistor;

each of the source electrode and the drain electrode is formed of a second line layer formed on the gate insulating film;

the second line layer comprises at least three metal layers which are a first metal layer made of a metal having a higher oxidation-reduction potential than that of an Al-based metal, a second metal layer made of an Al-based metal, and a surface layer as a third metal layer made of a metal having a higher oxidation-reduction potential than that of the Al-based metal, the first metal layer, the second metal layer and the third metal layer being formed in this order from a substrate side; and the transparent electrode layer is connected to an uppermost metal layer of the source electrode.

8. A method according to claim 7, wherein:

the third layer of the second line layer is wet-etched so that a width of the surface layer as the third metal layer becomes smaller than a width of a bottom portion of the second metal layer below the third metal layer, whereby the second line layer constitutes the source electrode-and the drain electrode of said each active element and a data line.

9. A method according to claim 7, wherein the first and third metal layers of the second line layer contain chromium (Cr).

* * * * *